United States Patent [19]
Hirota et al.

[11] Patent Number: 5,372,962
[45] Date of Patent: Dec. 13, 1994

[54] METHOD OF MAKING A SEMICONDUCTOR INTEGRATED CIRCUIT DEVICE HAVING A CAPACITOR WITH A POROUS SURFACE OF AN ELECTRODE

[75] Inventors: Toshiyuki Hirota; Ichirou Honma; Hirohito Watanabe; Masanobu Zenke, all of Tokyo, Japan

[73] Assignee: NEC Corporation, Tokyo, Japan

[21] Appl. No.: 11,855

[22] Filed: Feb. 1, 1993

[30] Foreign Application Priority Data

Jan. 31, 1992 [JP] Japan ................................ 4-015706

[51] Int. Cl.$^5$ .......................................... H01L 21/70
[52] U.S. Cl. .................................... 437/47; 437/46; 437/173; 437/919; 437/60; 148/DIG. 138
[58] Field of Search .................. 437/47, 48, 52, 60, 437/919, 977, 173, 46; 148/DIG. 138

[56] References Cited

U.S. PATENT DOCUMENTS

| | | | |
|---|---|---|---|
| 5,068,199 | 11/1991 | Sandhu | 437/919 |
| 5,082,797 | 1/1992 | Chan et al. | 437/47 |
| 5,112,773 | 5/1992 | Tuttle | 437/919 |
| 5,134,086 | 7/1992 | Ahn | 437/47 |
| 5,138,841 | 8/1992 | Sandhu . | |
| 5,227,322 | 7/1993 | Ko et al. | 437/47 |
| 5,234,857 | 8/1993 | Kim et al. | 437/47 |

FOREIGN PATENT DOCUMENTS

| | | |
|---|---|---|
| 0436491 | 7/1991 | European Pat. Off. . |
| 3139882 | 6/1991 | Japan . |
| 3263864 | 11/1991 | Japan . |

OTHER PUBLICATIONS

Patent Abstracts of Japan, vol. 16, No. 73, 21 Feb. 1992.
Patent Abstracts of Japan, vol. 15, No. 359, 11 Sep. 1991.

*Primary Examiner*—R. Bruce Breneman
*Attorney, Agent, or Firm*—Sughrue, Mion, Zinn, Macpeak & Seas

[57] ABSTRACT

A capacitor incorporated in a semiconductor integrated circuit device is expected to have a large amount of capacitance without increase of the occupation area, and has a lower electrode increased in surface area by using a roughening technique selected from the group consisting of an anodizing technique, an anodic oxidation, a wet etching and a dry etching so that a surface of the lower electrode becomes porous, thereby increasing the capacitance.

20 Claims, 40 Drawing Sheets

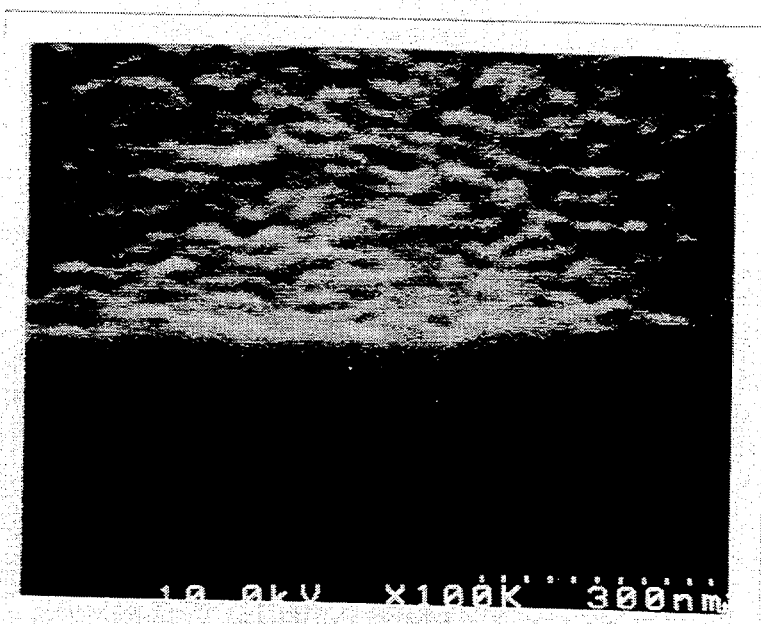
Fig·11B
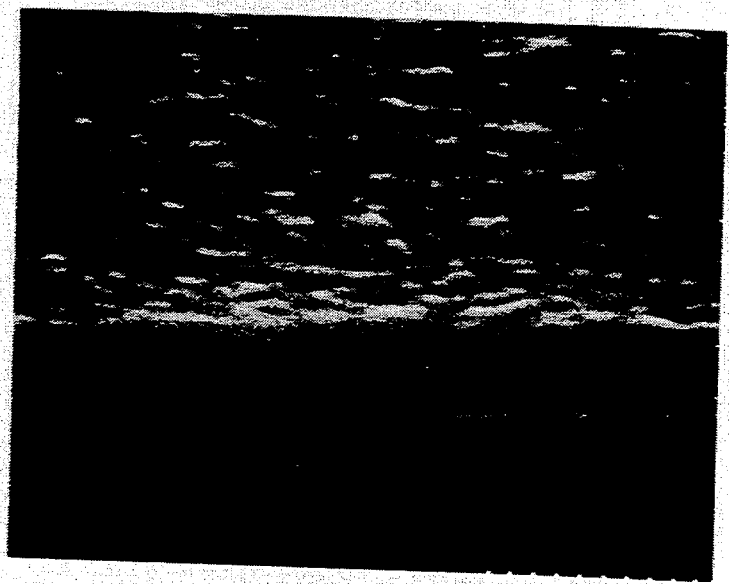
Fig·11C

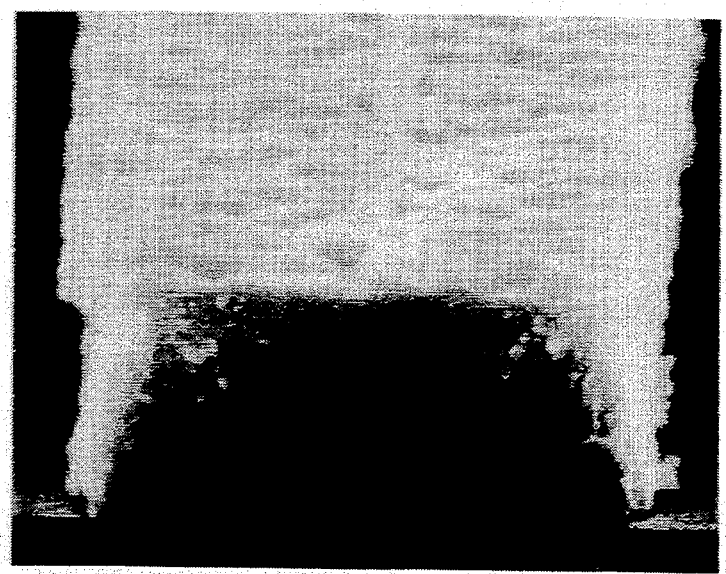
Fig·23
Fig·27

METHOD OF MAKING A SEMICONDUCTOR INTEGRATED CIRCUIT DEVICE HAVING A CAPACITOR WITH A POROUS SURFACE OF AN ELECTRODE

FIELD OF THE INVENTION

This invention relates to a semiconductor integrated circuit device and, more particularly, to the structure of a capacitor having an electrode covered with a porous surface and a process of fabrication thereof.

DESCRIPTION OF THE RELATED ART

A typical example of the stacked type capacitor incorporated in a semiconductor integrated circuit device is fabricated through the following process sequence illustrated in FIGS. 1A to 1F. The process sequence starts with preparation of a silicon substrate 1, and a silicon oxide film 2 is grown on the major surface of the silicon substrate 1 so as to electrically isolate a capacitor from other circuit component. Photoresist solution is spun onto the silicon oxide film 2, and the photoresist film is patterned through a lithographic process for patterning a mask film 3 on the silicon oxide film 2 as shown in FIG. 1A.

Using the mask film 3, the silicon oxide film 2 is partially removed by using a dry etching technique, and a contact hole 2a exposes a part of the silicon substrate 1. The resultant structure of this stage is shown in FIG. 1B. The mask film 3 is stripped off, and polysilicon is deposited over the entire surface of the structure for forming a polysilicon film 4 on the silicon oxide film 2. The polysilicon film 4 passes through the contact hole 2a, and is held in contact with the silicon substrate 1. Photoresist solution is spun onto the polysilicon film 4, and is patterned into a mask film 5 through the lithographic process. The resultant structure of this stage is illustrated in FIG. 1C.

Using the mask film 5, the polysilicon film 5 is partially etched away, and a lower electrode 4a of the stacked type capacitor is formed from the polysilicon film 5 as shown in FIG. 1D. The lower electrode 4a is defined by top and side surfaces, and the top and side surfaces are microscopically smooth.

The lower electrode 4a is covered with a dielectric film 6 as shown in FIG. 1E, and the dielectric film 6 in turn is covered with a polysilicon film 6. The polysilicon film 7 serves as an upper electrode, and the lower electrode 4a, the dielectric film 6 and the upper electrode 7 form in combination the prior art stacked type capacitor. The prior art stacked type capacitor is popular among semiconductor manufacturer, and is incorporated in various semiconductor integrated circuit device such as a dynamic random access memory device.

However, semiconductor integrated circuit devices are progressively enhanced in integration density, and, accordingly, an occupation area assigned to each circuit component is gradually decreased. Even though the occupation area is decreased, the capacitor is still expected to accumulate the same amount of electric charges. In this situation, various configurations have been proposed for increasing the surface area of the accumulation electrode, and a cylinder type accumulation electrode, a fin-shaped accumulation electrode and a trench-type electrode are well known to persons skilled in the art.

FIGS. 2A to 2D illustrate a prior art process sequence for fabricating a cylinder type stacked capacitor, and the process sequence starts with preparation of a silicon substrate 11. An inter-level insulating film 12 is grown on the silicon substrate 11, and a silicon nitride film 13 is deposited on the inter-level insulating film 12. Photoresist solution is spun onto the silicon nitride film 13, and a mask film (not shown) is patterned from the photoresist film. Using the mask film, the silicon nitride film 13 and the inter-level insulating film 12 are successively etched so that a contact hole 12a exposes a part of the silicon substrate 11. The mask film is then stripped off.

A polysilicon film and a silicon oxide film are successively deposited over the entire surface of the structure, and a mask film (not shown) is patterned from a photoresist film on the silicon oxide film. The silicon oxide film and the polysilicon film are partially etched away, and a supporting structure 14 and a silicon oxide film 15 are left on the silicon nitride film 13. The supporting structure 14 passes through the contact hole 12a, and is held in contact with the silicon substrate 11.

A polysilicon film 16 is deposited over the entire surface of the structure, and the resultant structure of this stage is illustrated in FIG. 2A. The polysilicon film 16 is subjected to a reactive ion etching without any mask film, and the ion bombardment removes a part of the polysilicon film 16 on the top surface of the silicon oxide film 15 and parts of the polysilicon film 16 on the silicon nitride film 13. However, the polysilicon film 16 are left on the side surfaces of the silicon oxide film 15 and the supporting structure, and serves as a lower electrode 16a. The resultant structure of this stage is illustrated in FIG. 2B.

The silicon oxide film 15 is etched away in an etching solution containing hydrofluoric acid, and the lower electrode 16a upwardly projects from the supporting structure as shown in FIG. 2C.

A composite dielectric film structure 17 covers the lower electrode 16a, and consist of a silicon nitride film and a silicon oxide film. Finally, a polysilicon film is deposited over the entire surface of the structure, and an upper electrode 18 is formed from the polysilicon film as shown in FIG. 2D.

The cylinder type stacked capacitor thus fabricated is increased in surface area, because both inner and outer surfaces of the lower electrode 16a are opposed through the composite dielectric film structure 17 to the upper electrode 18. However, the inner and outer surfaces of the lower electrode 16a are microscopically smooth as similar to the ordinary stacked type capacitor shown in FIG. 1F. For this reason, the cylinder type stacked capacitor is not large enough in capacitance to form an advanced dynamic random access memory cell. Moreover, the cylinder type stacked capacitor as well as the other proposed configurations are fabricated through complex process sequences, and the complex process sequences result in low reproducibility.

The present inventors contemplate a solution of these drawbacks, and proposed an electrode covered with hemispherical silicon grains in Japanese Patent Application No. 3-272165 filed on Mar. 20, 1990. In the proposed process, hemispherical silicon grains are densely grown through a low-pressure chemical vapor deposition, and the hemispherical silicon grain layer is patterned by using a dry etching technique so as to form a lower electrode of the capacitor. The hemispherical silicon grains are expected to increase the surface area of the lower electrode, and the capacitance is increased without any increment of the occupation area of the capacitor.

However, while the hemispherical silicon grain layer is subjected to the dry etching, the hemispherical grains are also grinded, and the hemispherical grain layer becomes smooth. For this reason, the proposed capacitor hardly achieves the expected capacitance.

The present inventors further proposed a process of growing a hemispherical silicon grain layer for a capacitor electrode in Japanese Patent Application No. 3-53933 filed on Feb. 26, 1991. According to the proposed process sequence, amorphous silicon is deposited to form a smooth surface, and the smooth amorphous silicon layer is patterned through a lithographic stage followed by an etching stage into a predetermined configuration for the capacitor electrode. Since silicon oxide and carbon particles are adhered to the surface of the smooth amorphous silicon layer during the lithographic and etching stages, the silicon oxide and the carbon particles are removed from the smooth amorphous silicon layer, and the clean amorphous silicon layer is treated with heat in vacuum or inert gas ambience. While the amorphous silicon layer is heated, the surface portion is melted and crystallized, and the crystallized surface becomes rough. The proposed process sequence effectively increases the surface area of the capacitor electrode, and the rugged surface is free from the etching stage.

However, the process sequence proposed in Japanese Patent Application No. 3-53933 is complex and expensive. This is because of the fact that the cleaning stage is indispensable before the crystallization stage, and the high temperature ambience should be clean for crystallization. This means that large amount of time and labor is necessary for the capacitive electrode, and the proposed process sequence is expensive. Moreover, the rugged surface is only twice as wide as the smooth surface, and is hardly applicable to an advanced dynamic random access memory device such as 4 G-bit dynamic random access memory devices.

SUMMARY OF THE INVENTION

It is therefore an important object of the present invention to provide a semiconductor device the capacitor electrode of which has a porous surface for increasing the surface area.

It is also an important object of the present invention to provide a process of fabricating the semiconductor device which is simple rather than the proposed processes.

To accomplish the object, the present invention proposes to roughen the surface of a capacitor electrode by using selectivity of an etchant.

In accordance with one aspect of the present invention, there is provided a semiconductor device fabricated on a substrate, comprising: a component element of an electric circuit improved in electric characteristics by increasing the amount of surface area thereof, and having a porous surface produced by using a roughening technique selected from the group consisting of an anodizing technique, an anodic oxidation, a wet etching and a dry etching.

In accordance with another aspect of the present invention, there is provided a semiconductor integrated circuit device fabricated on a substrate: comprising a capacitor having a first electrode with a porous surface portion produced by using a roughening technique selected from the group consisting of an anodizing technique, an anodic oxidation, a wet etching and a dry etching, a dielectric layer conformally covering a surface of micro-recesses formed in the porous surface portion for producing secondary micro-recesses, and a second electrode filling the secondary micro-recesses and opposed through the dielectric layer to the porous surface portion of the first electrode.

In accordance with yet another aspect of the present invention, there is provided a process of fabricating a semiconductor device comprising the steps of: a) preparing a substrate for an integrated circuit having a capacitor; b) forming a semiconductor block for a lower electrode of the capacitor; c) perforating a predetermined surface portion of the semiconductor block by using a roughening technique selected from the group consisting of an anodizing technique, an anodic oxidation, a wet etching and a dry etching so that the predetermined surface portion of the semiconductor block becomes porous; d) conformally covering at least the predetermined source portion of the semiconductor block with a dielectric layer; and e) forming an upper electrode in such a manner as to oppose through the dielectric layer to the predetermined surface portion of the semiconductor block.

BRIEF DESCRIPTION OF THE DRAWINGS

The features and advantages of the semiconductor device and the process of fabrication thereof according to the present invention will be more clearly understood from the following description taken in conjunction with the accompanying drawings in which:

FIGS. 11A to 11C are scanning electron microscope photographs showing surfaces of an intentionally un-doped polysilicon treated with phosphoric acid;

FIG. 23 is a scanning electron microscope photograph showing a surface of a doped polysilicon treated with chlorine radicals in a parallel plate reactive ion etching system;

FIG. 27 is a scanning electron microscope photograph showing a surface of an amorphous silicon film.

DESCRIPTION OF THE PREFERRED EMBODIMENT

Configurations of Capacitor Electrode

Referring to FIGS. 3A to 3E of the drawings, various capacitor electrodes are constructed on or in single crystal silicon substrates 21, 22, 23, 24 and 25, and the present invention appertains to any one of the capacitor electrodes. Of course, these capacitor electrodes are illustrated by way of example, and the present invention is applicable to any other capacitor electrode presently known or proposed in future. Although only the capacitor electrodes are illustrated in FIGS. 3A to 3E, the capacitor electrodes are respectively covered with dielectric layers which in turn are held in contact with upper electrodes, respectively. The dielectric layers are implemented by either single or composite dielectric film structure, and the upper electrode is formed of either semiconductor or metallic substance. As will be described hereinbelow, the capacitor electrodes are formed of either single crystal, poly or amorphous silicon, and word "silicon" does net mean single crystal silicon only in the following description. When specifying the crystalline, the word "silicon" is modified by word "amorphous", "poly" or "single".

Figure 1A:
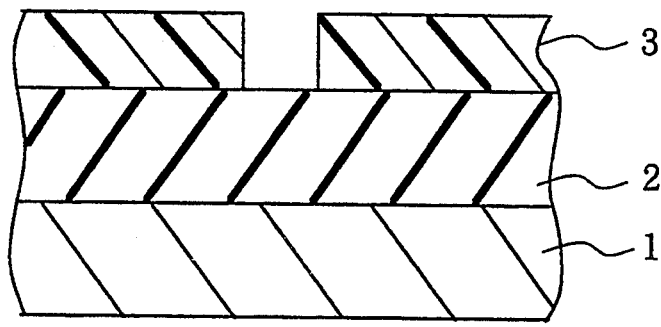
FIGS. 1A to 1F are cross sectional views showing the prior art process sequence for fabricating the stacked type capacitor.
Figure 1B:
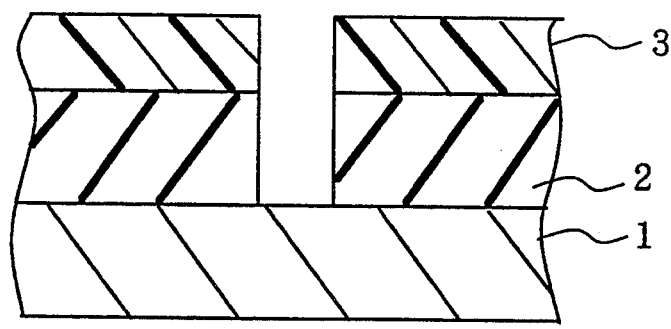
Figure 1C:
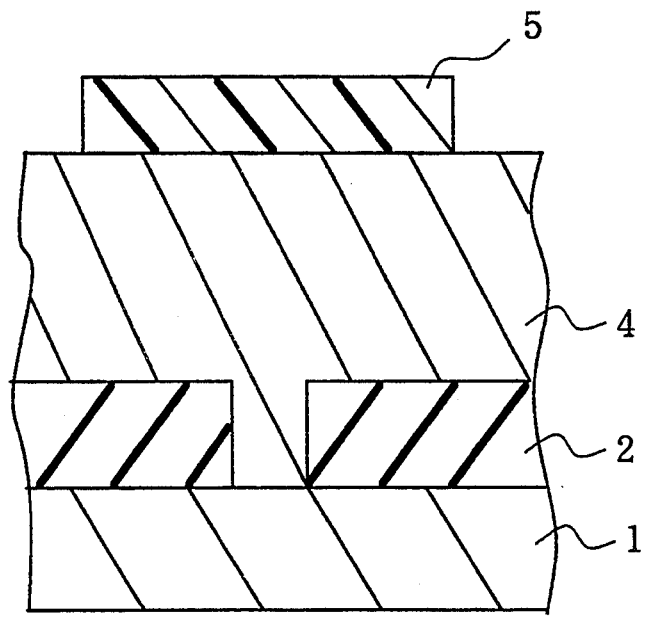
Figure 1D:
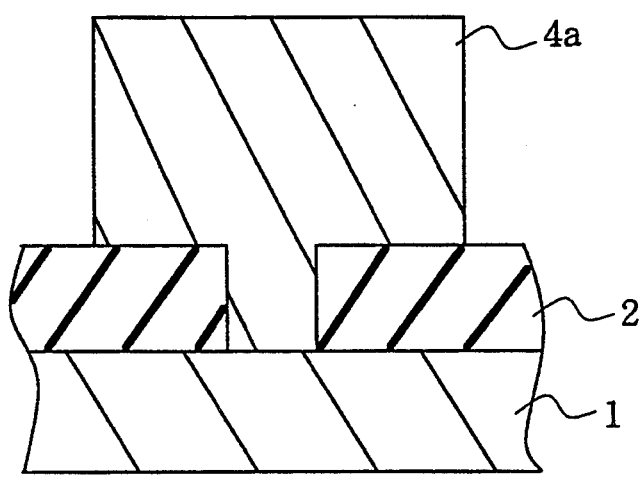
Figure 1E:
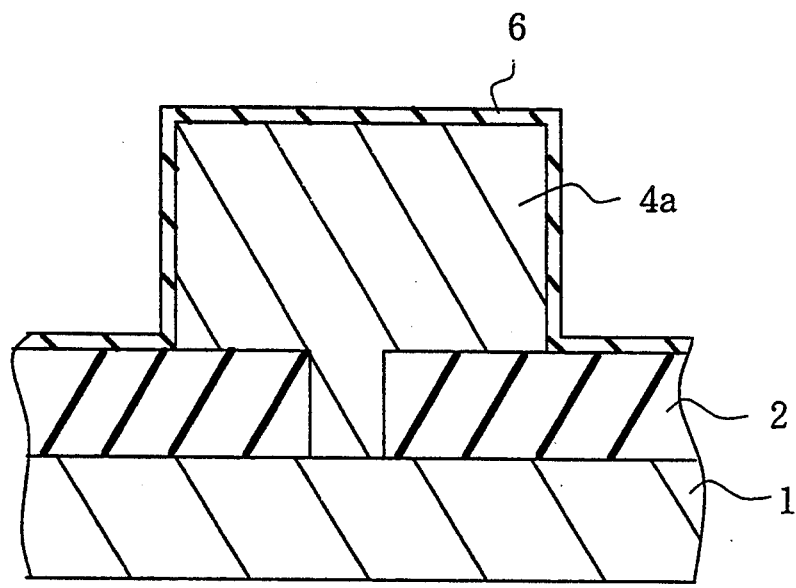
Figure 1F:
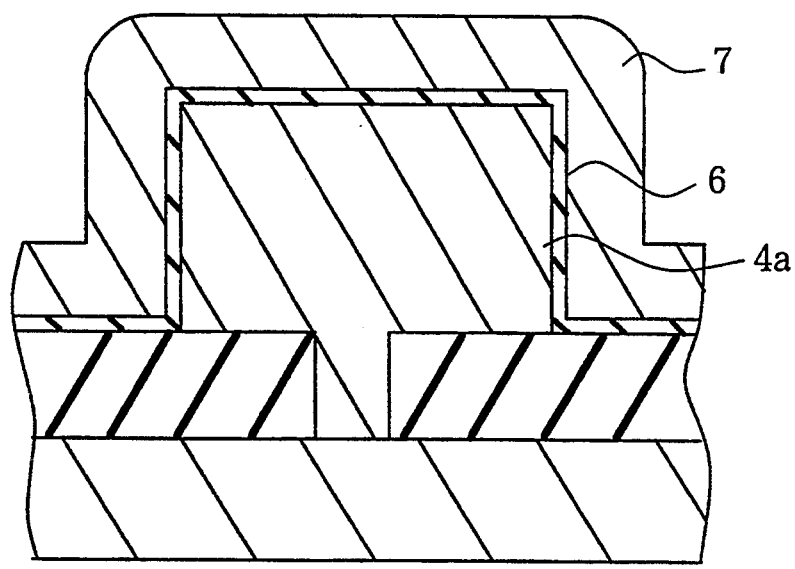
Figure 2A:
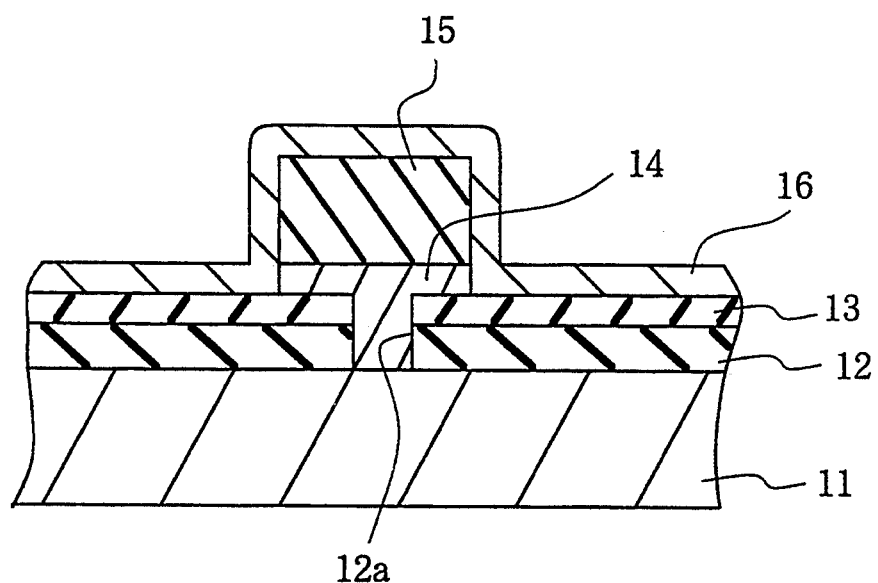
FIGS. 2A to 2D are cross sectional views showing the prior art process sequence for fabricating the cylinder type stacked capacitor.
Figure 2B:
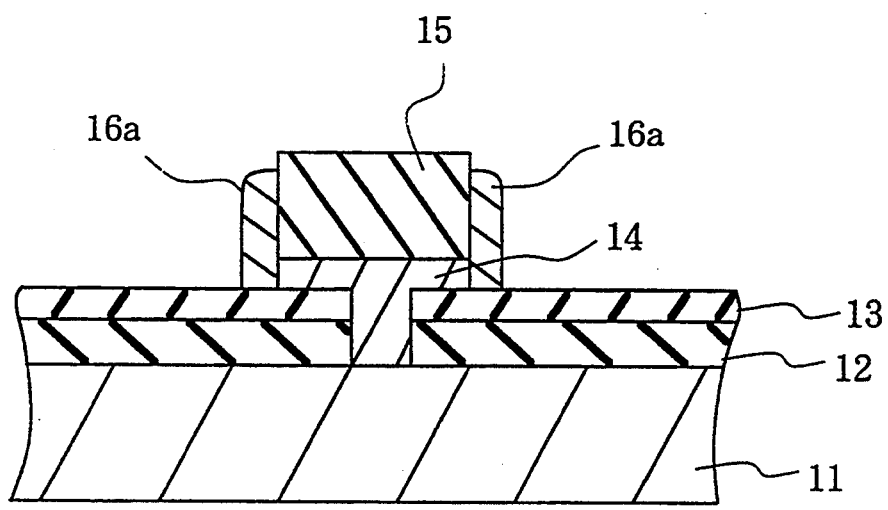
Figure 2C:
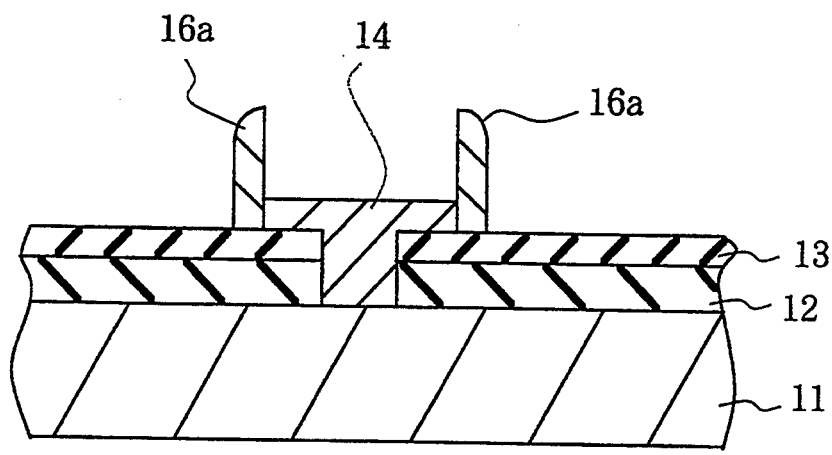
Figure 2D:
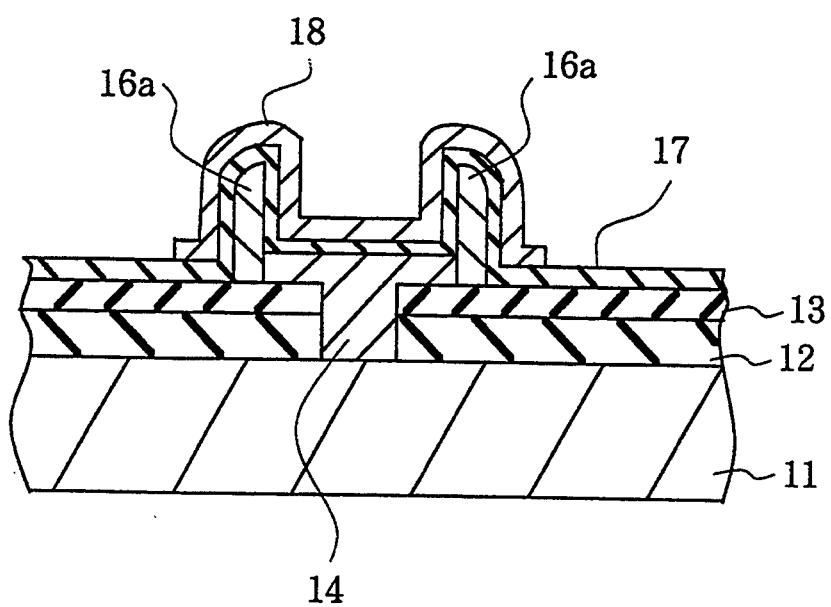
Figure 3A:
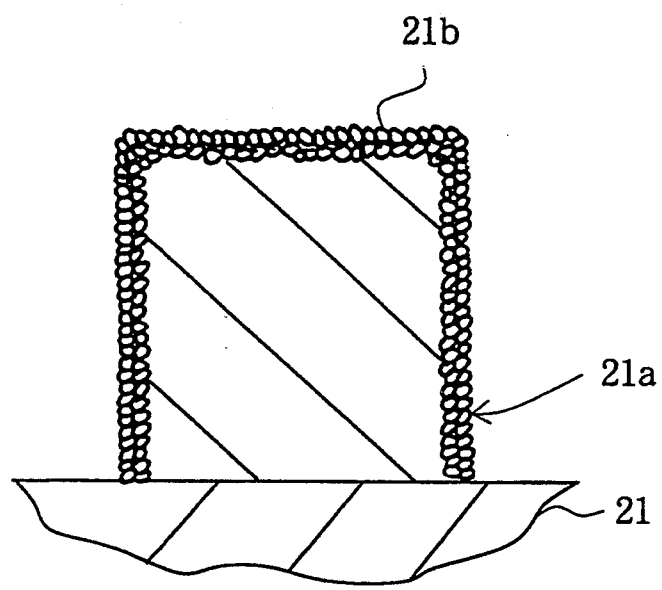
FIGS. 3A to 3E are cross sectional views showing various capacitor electrodes to which the present invention appertains.

The capacitor electrode of silicon shown in FIG. 3A serves as a lower electrode 21a of an ordinary stacked capacitor, and the surface of the capacitor electrode is microscopically perforated so as to form a porous silicon film 21b.

Figure 3B:
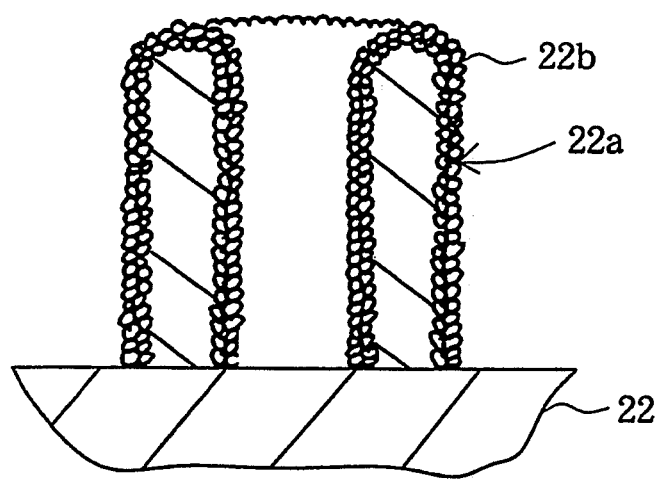

The capacitor electrode of silicon shown in FIG. 3B serves as a lower electrode 22a of a cylinder type stacked capacitor, and both inner and outer surfaces of the lower electrode 22a are microscopically perforated so that a porous silicon film 22b covers the inner and outer surfaces.

Figure 3C:
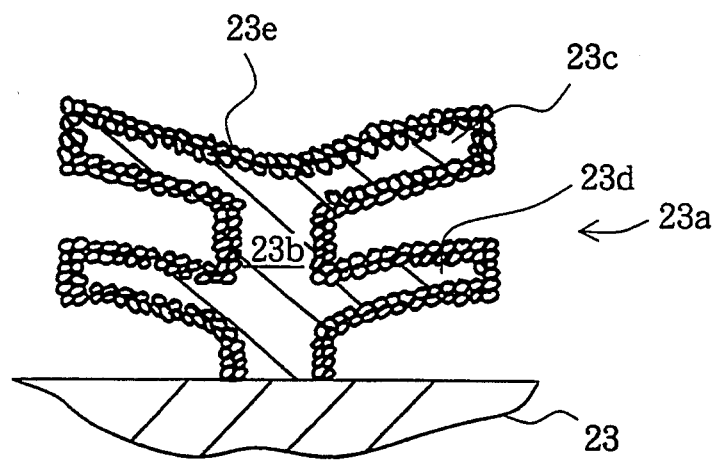

The capacitor electrode of silicon shown in FIG. 3C serves as a lower electrode 23a of a fin type stacked capacitor, and has a stem portion 23b and fin portions 23c and 23d radially projecting from the stem portion 23b. Not only the exposed surface of the stem portion 23b but also the surfaces of the fin portions 23c and 23d are microscopically perforated so that the lower electrode 23a is covered with a porous silicon film 23e.

Figure 3D:
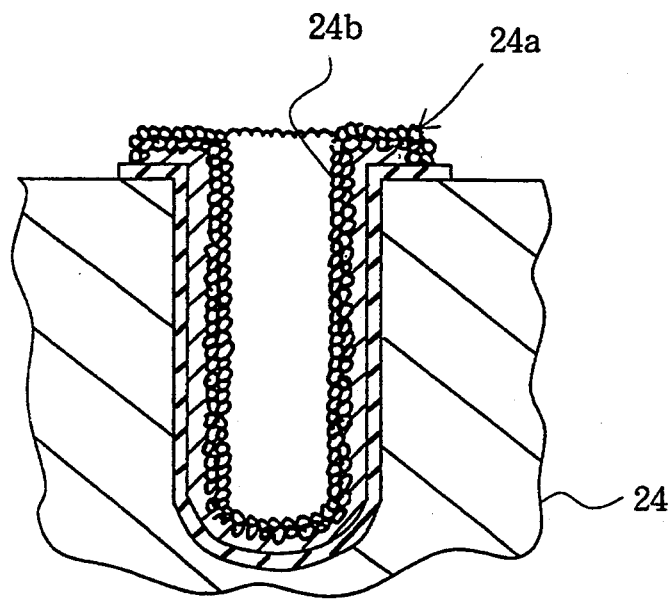

FIG. 3D shows a lower electrode 24a of a stacked trench capacitor, and is partially embedded in the silicon substrate 24. The surface of the lower electrode 24a is microscopically perforated, and a porous silicon film 24b covers the lower electrode 24a.

Figure 3E:
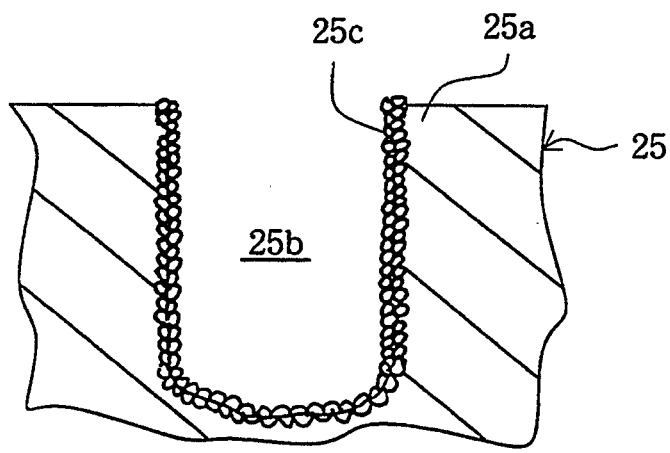

Finally, FIG. 3E shows a lower electrode 25a of an ordinary trench type capacitor, and the silicon substrate 25 per se serves as the lower electrode 25a. The lower electrode 25a is exposed to a trench 25b, and the surface of the lower electrode 25a is microscopically perforated so that the trench 25b is defined by a porous silicon film 25c.

First Embodiment

Figure 4A:
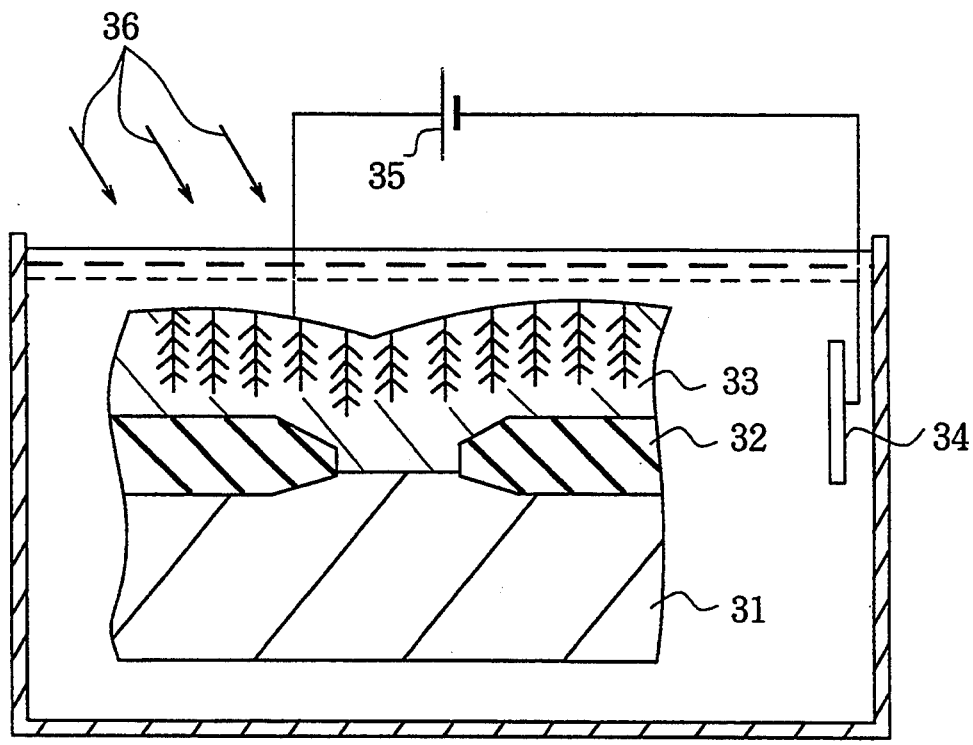
FIGS. 4A to 4D are cross sectional views showing a first process sequence according to the present invention.

Turning to FIGS. 4A to 4D of the drawings, the first process sequence embodying the present invention starts with preparation of a single crystal silicon substrate 31. A field oxide film 32 is selectively grown on the major surface of the single crystal silicon substrate 31 through a selective oxidation process such as the LOCOS process. Polysilicon is deposited over the entire surface of the structure through a low pressure chemical vapor deposition process so as to form a polysilicon film 33, and the polysilicon film 33 is doped with impurities without any mask layer. The doped polysilicon 33 is subjected to an anodizing, and a surface portion of the doped polysilicon 33 becomes porous as shown in FIG. 4A. In FIG. 4A, rooty pattern is indicative of micro-recesses formed in the surface portion.

The anodizing process starts with preparation of a platinum cathode 34, water solution of hydrofluoric acid and an appropriate current source 35, and the hydrofluoric acid ranges from 5% to 40% by volume. The doped polysilicon film 33 and the platinum cathode 34 are put into the water solution, and are coupled with the current source 35. Direct current flows between the doped polysilicon film 33 or the anode and the platinum cathode 34 at several milli-ampere/cm$^2$ to hundreds milli-ampere/cm$^2$. Then, the doped polysilicon film 33 is perforated, and becomes porous. While the doped polysilicon film 33 is perforated, visual light to ultra violet light 36 may be radiated to the doped polysilicon film 33. The visual to ultra violet light 36 produces holes, and promotes the chemical reaction for the micro-recesses.

Figure 4B:
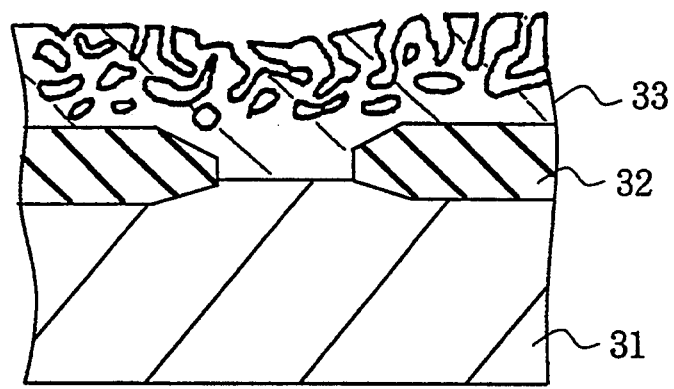

The micro-recesses thus produced range from 2 nanometers to 10 nano-meters, and the volume density of the porous silicon ranges from 20% to 80% of the bulk density of the doped polysilicon film 33. If the micro-recesses are less than 2 nano-meters in diameter, a dielectric layer tends to fill the micro-recesses, and can not conformally extend over the surface. In order to expand the micro-recesses, the porous polysilicon is treated with heat at 800 degrees to 900 degrees in centigrade. The heat treatment expands the micro-recesses, and the micro-recesses are expanded to tens nano-meters as shown in FIG. 4B. While the porous silicon is treated with heat, oxygen reacts with the silicon, and undesirable silicon oxide covers the surface of the porous silicon. The silicon oxide restricts the movement of silicon atoms, and the micro-recesses are insufficiently expanded. In order to prevent the porous silicon from the undesirable silicon oxide, the partial pressure of oxygen should be equal to or less than $10^{-6}$ torr in the high temperature atmosphere. The heat treatment is further effective against internal stress produced in the anodizing stage.

Photoresist solution is spun onto the entire surface of the structure, and the photoresist film is patterned through a lithographic process for forming a mask layer (not shown) on the porous polysilicon film 33. Using the mask layer, the porous polysilicon film 33 is partially etched away, and a lower electrode 33a is formed on the silicon substrate 31. A silicon nitride film is deposited over the entire surface of the structure to thickness of 8 nano-meters to 15 nano-meters through a low-pressure chemical vapor deposition, and the low pressure chemical vapor deposition is carried out in gaseous mixture of $SiH_2Cl_2$ gas and $NH_3$ gas regulated to 0.2 to 0.4 torr at 600 degrees to 700 degrees in centigrade. The reason why the deposition is carried out at low temperature is that the deposition speed is controlled by the chemical reaction on and around the newly created surface. For this reason, the silicon nitride film is conformally deposited on the inner surface of the micro-recesses, and does not fill the micro-recesses. The silicon nitride film is, then, oxidized in steam containing atmosphere at 850 degrees in centigrade for 10 minutes, and a silicon oxide film is laminated on the silicon nitride film. The silicon nitride film and the silicon oxide film form in combination a composite dielectric layer 37. The oxidation in the steam containing atmosphere is desirable for electrical isolation between the lower electrode 33a and an upper electrode described hereinbelow, because silicon oxide grows over pin holes in the porous polysilicon and week spots on the porous polysilicon.

Figure 4C:
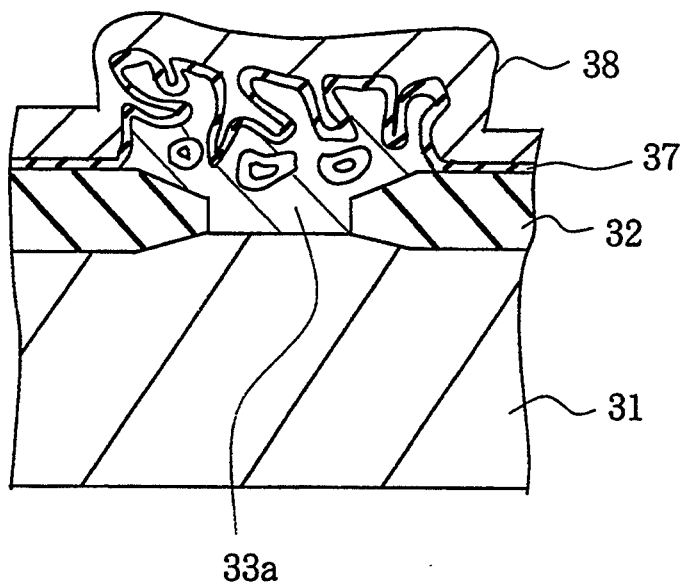

Subsequently, polysilicon is deposited over the entire surface of the structure through the low pressure chemical vapor deposition so as to form a polysilicon film 38, and the resultant structure of this stage is illustrated in FIG. 4C.

Figure 4D:
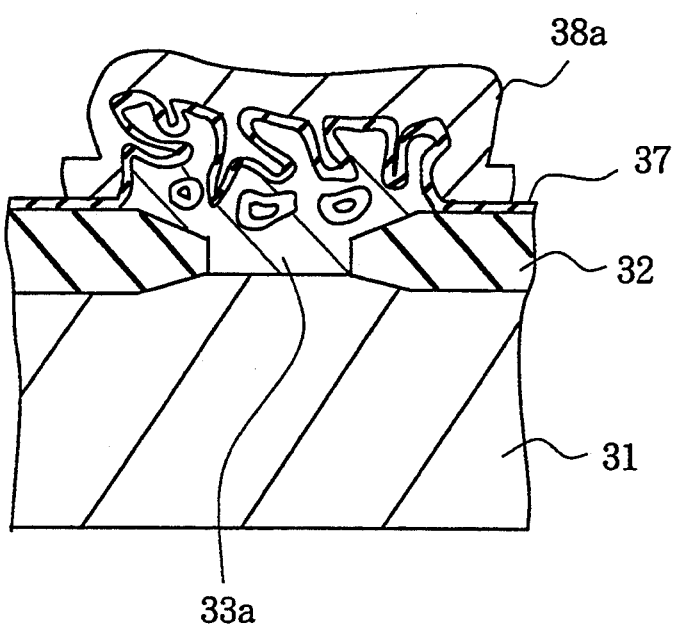

Photoresist solution is spun onto the polysilicon film 38, and is patterned into a mask layer (not shown) through the lithographic process. Using the mask layer, the polysilicon film 38 is partially etched away, and an upper electrode 38a is left on the composite dielectric layer 37 as shown in FIG. 4D.

Figure 5A:
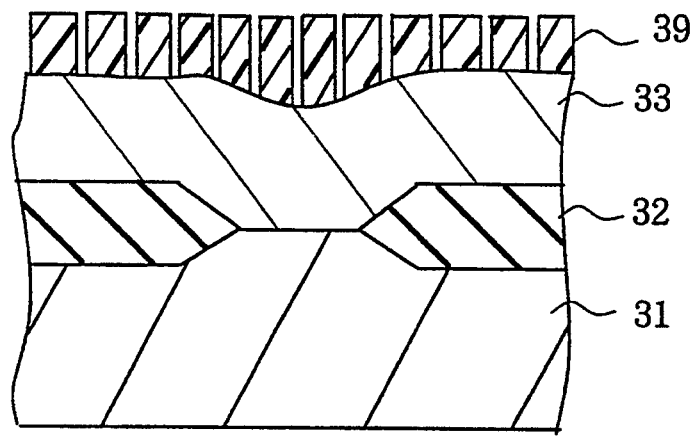
FIGS. 5A to 5B are cross sectional views showing an alternative process sequence according to the present invention.
Figure 5B:
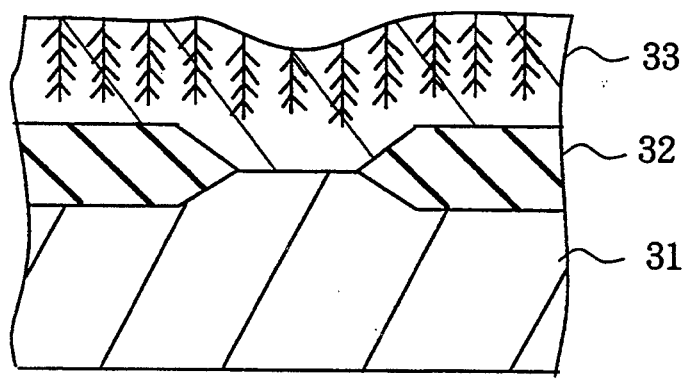

A dry etching process is available for perforating. Namely, a mask layer 39 is patterned from a photoresist film through the lithographic process as shown in FIG. 5A, and the doped polysilicon film 33 is subjected to ion bombardment in the dry etching. As a result, micro-recesses are formed in the polysilicon film 33 as shown in FIG. 5B, and the process sequence returns to the stage described in conjunction with FIG. 4B.

As will be understood from the foregoing description, the anodizing stage according to the present invention forms micro-recesses in the polysilicon film 33, and the micro-recesses effectively increase the surface area of the lower electrode 33a.

Second Embodiment

Figure 6C:
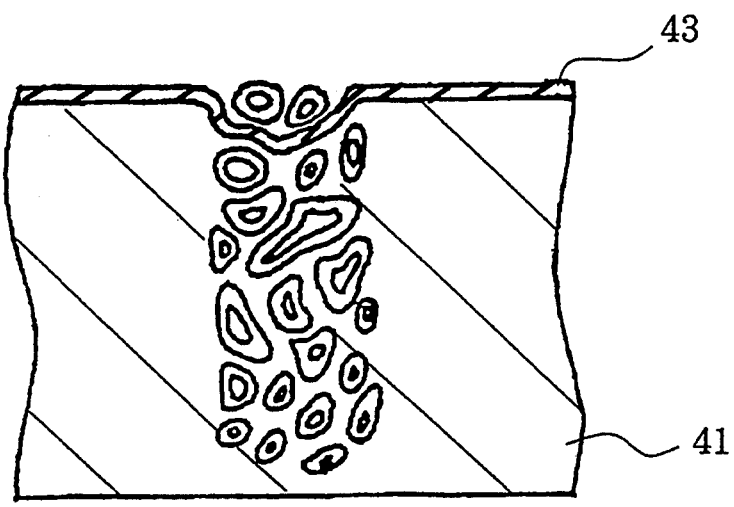
FIGS. 6A to 6D are cross sectional views showing a second process sequence according to the present invention.
Figure 6D:
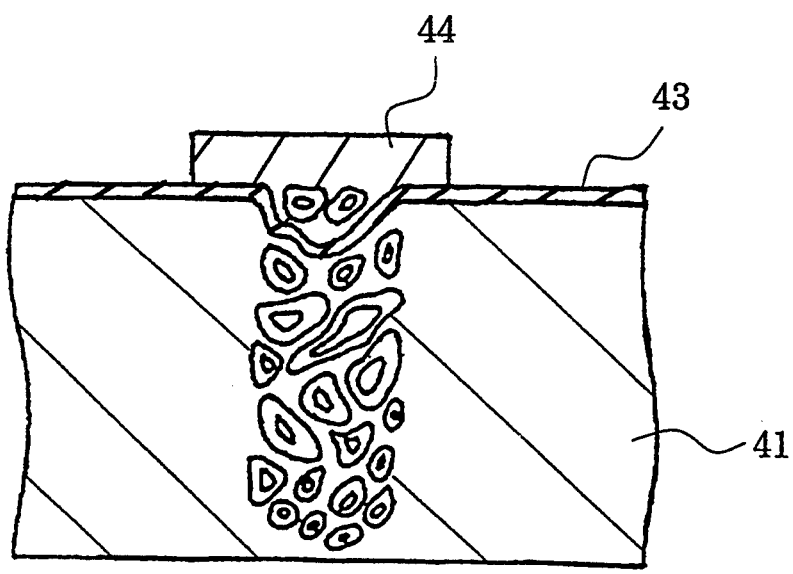
Figure 6A:
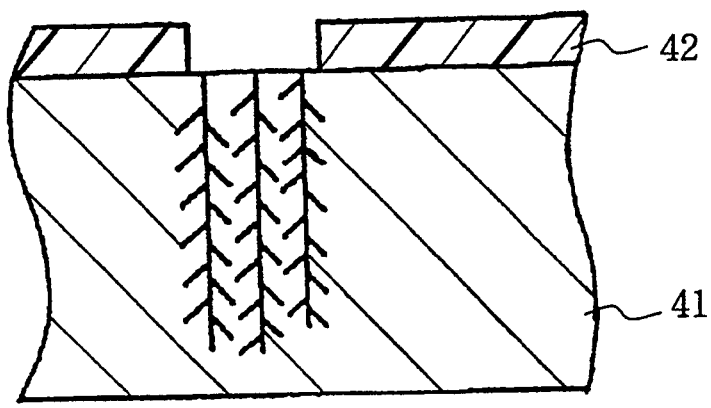

Turning to FIGS. 6A to 6D of the drawings, the second process sequence embodying the present invention starts with preparation of a single crystal silicon substrate 41. The second process sequence is used for fabricating a trench capacitor. Photoresist solution is spun onto the major surface of the silicon substrate 41, and is patterned through the lithographic process for a mask layer 42. The silicon substrate 41 partially covered with the mask layer 42 is dipped into electrolyte, and an anodic oxidation is carried out in the electrolyte. Then, the exposed silicon substrate 41 is perforated as shown in FIG. 6A, and the rooty pattern is indicative of porous silicon portion. A large number of micro-recesses take place in the porous silicon portion, and the micro-recesses increases the surface area of the exposed silicon substrate 41.

Figure 6B:
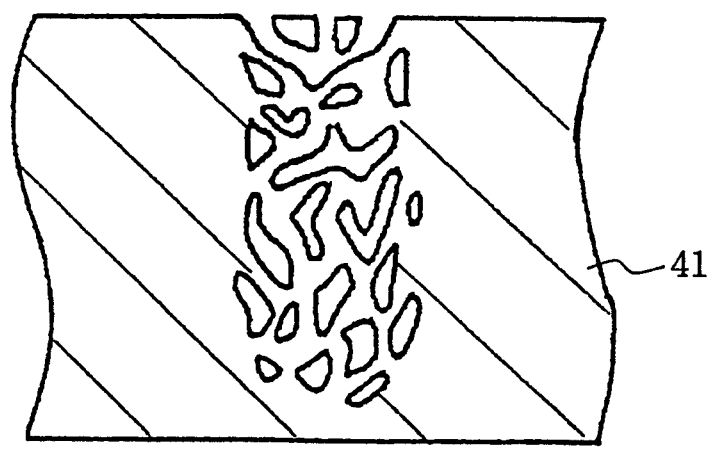

The mask layer 42 is stripped off, and the silicon substrate 41 is treated with heat in non-oxidizable ambience as similar to the first embodiment. As a result, the micro-recesses are expanded as shown in FIG. 6B.

A silicon nitride film is deposited on the entire surface of the structure through a low pressure chemical vapor deposition, and the silicon nitride film conformally extends along the inner surfaces of the micro-recesses. The silicon nitride film is partially oxidized in steam containing atmosphere, and the silicon nitride film and the silicon oxide film form in combination a composite dielectric layer 43 as shown in FIG. 6C. In FIG. 6C, some rings floats over the composite dielectric layer 43, and the floating rings are indicative of the composite dielectric layer 43 not to fill the micro-recesses.

Polysilicon is deposited over the entire surface of the structure through a low pressure chemical vapor deposition, and the polysilicon film is doped with impurities. Photoresist solution is spun onto the entire surface of the polysilicon film, and is patterned into a mask layer (not shown) through the lithographic process. Using the mask layer, the doped polysilicon film is partially etched away, and an upper electrode 44 is left on the composite dielectric layer 43. As will be seen from FIG. 6D, the polysilicon fills secondary micro-recesses defined by the composite dielectric layer 43, and the surface area is effectively increased.

Thus, the porous silicon portion is produced from the single crystal silicon, and, for this reason, the present invention is applicable to the trench capacitor as well as the stacked trench capacitor. The trench capacitor and the stacked trench capacitor are desirable for creating smooth surface, and wiring strips over the trench capacitor and the stacked trench capacitor are less liable to be disconnected.

Third Embodiment

Figure 7A:
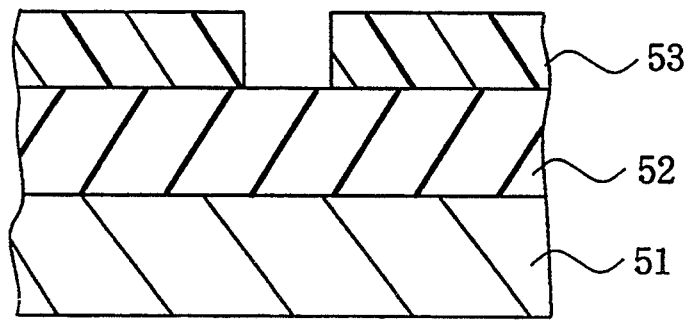
FIGS. 7A to 7F are cross sectional views showing a third process sequence according to the present invention.

Turning to FIGS. 7A to 7F of the drawings, the third process sequence starts with preparation of a single crystal silicon substrate 51. A silicon oxide film 52 is grown on the major surface of the silicon substrate 51 for electrical isolation, and solution of photoresist is spun onto the silicon oxide film 52. The photoresist film is patterned into a mask layer 53 through the lithographic process, and the resultant structure of this stage is illustrated in FIG. 7A.

Figure 7B:
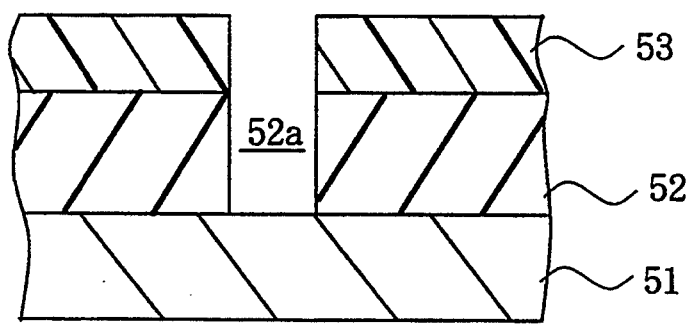

Using the mask layer 53, the silicon oxide film 52 is partially removed by using a dry etching, and a contact hole 52a is formed in the silicon oxide film 52 as shown in FIG. 7B.

Figure 7C:
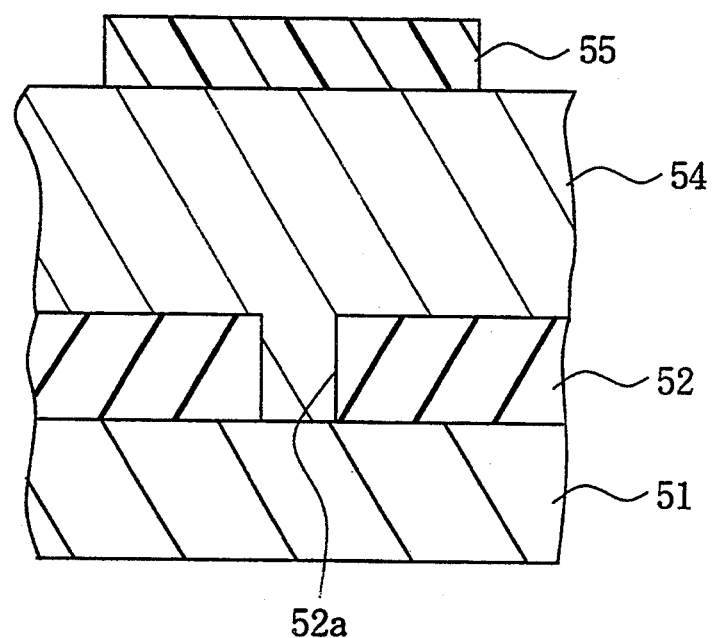

Polysilicon is deposited on the entire surface of the structure through a low pressure chemical vapor deposition at 600 degrees in centigrade, and a polysilicon film 54 is held in contact with the silicon substrate 51 through the contact hole 52a. The polysilicon film 54 is exposed to $POCl_3$ gas at 800 degrees in centigrade for 30 minutes, and phosphorus atoms are introduced into the polysilicon film 54. The phosphorus atoms tend to be segregated at boundaries of silicon grains of the polysilicon film 54 as well as around dislocations. Photoresist solution is spun onto the doped polysilicon film 54, and is patterned into a mask film 55 through the lithographic process as shown in FIG. 7C.

Figure 7D:
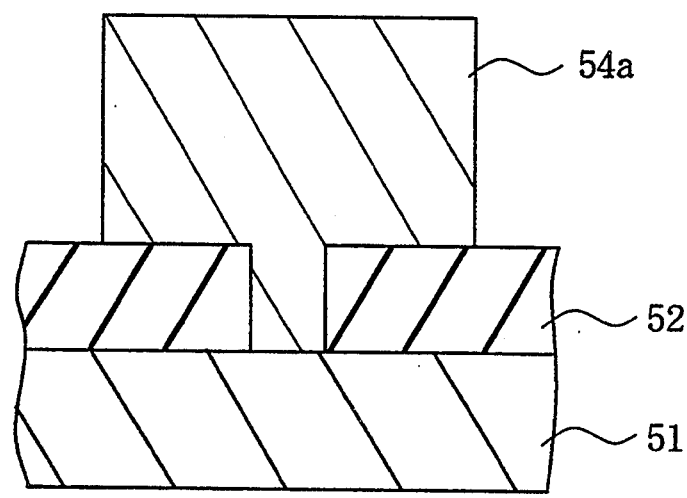
Figure 8:
FIG. 8 is a scanning electron microscope photograph showing a lower electrode before a perforating stage.

Using the mask film 55, the doped polysilicon film 54 is partially removed through a reactive ion etching, and a lower electrode 54a is left on the silicon oxide film 52 as shown in FIG. 7D. FIG. 8 is a scanning electron microscope photograph taken upon completion of the reactive ion etching, and the magnification ratio of the photo image was sixty thousand. The surface of the doped polysilicon was relatively smooth.

Figure 7E:
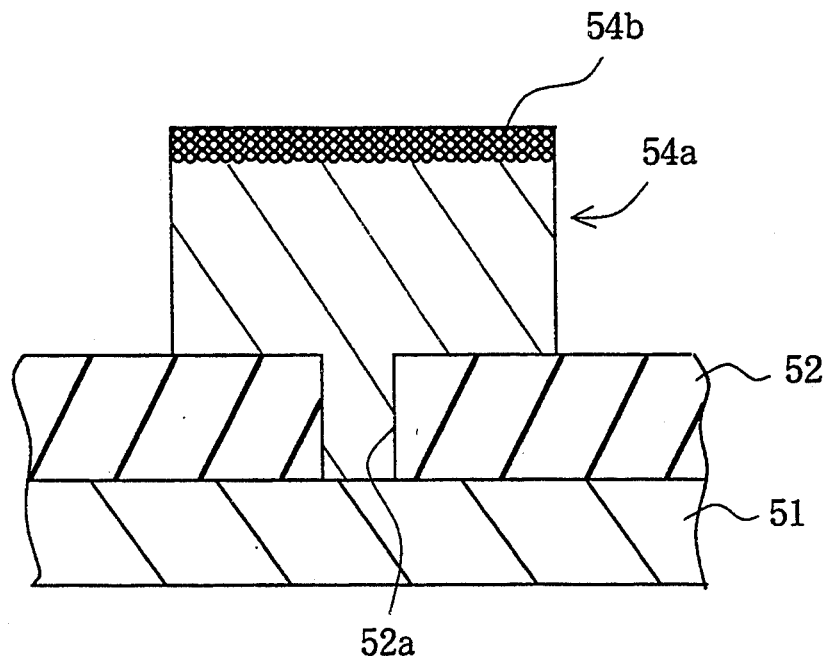

Subsequently, the lower electrode 54a is dipped in an etchant containing phosphoric acid ($H_3PO_4$). In detail, the etchant is heated to 140 degrees in centigrade, and the lower electrode 54a is dipped in the etchant for 90 minutes. As described hereinbefore, the phosphorus atoms are segregated along the grain boundaries as well as around the dislocations, and the etchant proceeds in heavily doped polysilicon faster than the etching in a lightly doped polysilicon. For this reason, the grain boundaries and the heavily doped portions around the dislocations are selectively etched by the phosphoric acid, and the surface 54b of the lower electrode 54a is perforated through treatment with phosphoric acid as shown in FIG. 7E.

Figure 9:
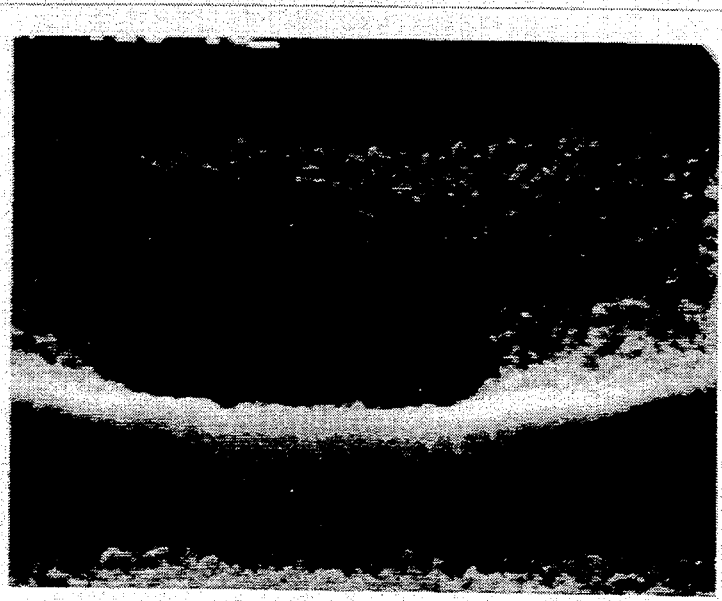
FIG. 9 is a scanning electron microscope photograph showing a lower electrode after the perforating stage.
Figure 10A:
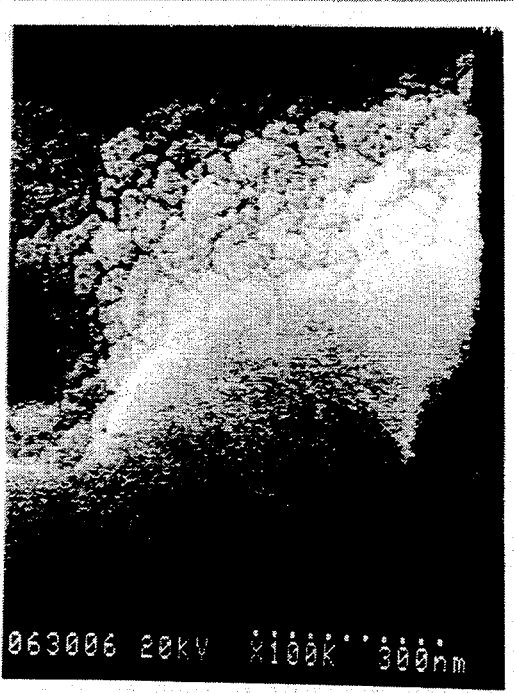
FIGS. 10A to 10C are scanning electron microscope photographs showing the micro-recesses of the lower electrode at different magnification ratios.
Figure 10B:
Figure 10C:

FIG. 9 is a scanning electron microscope photograph taken upon completion of the treatment of the phosphoric acid, and the magnification ratio of the photo image was also sixty thousand. Comparing the photo image shown in FIG. 8 with the photo image shown in FIG. 9, it is understood that micro-recesses took place over the surface of the lower electrode 54a by virtue of the phosphoric acid treatment. The micro-recesses are observed in scanning electron microscope photographs of FIGS. 10A, 10B and 10C, and the photo images in FIGS. 10A to 10C were magnified at a hundred thousand, two hundred thousand and four hundred fifty thousand, respectively. The micro-recesses measured from several nano-meters to tens nano-meters.

Figure 11A:
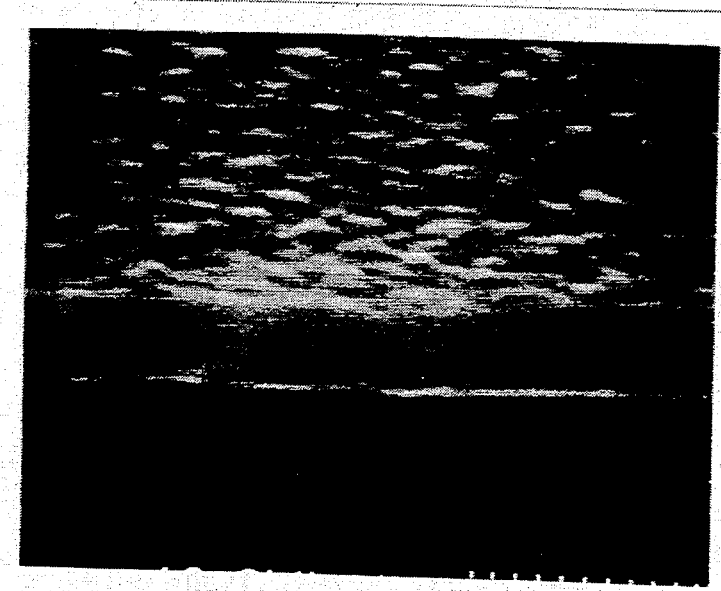
Figure 12A:
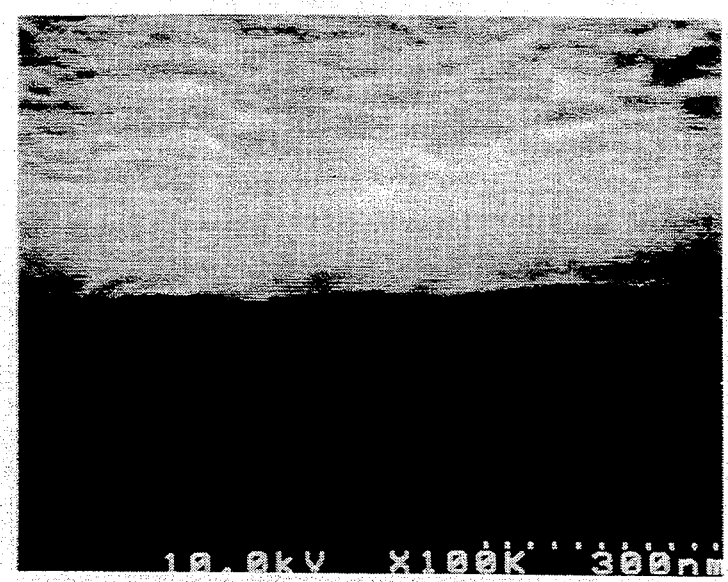
FIGS. 12A to 12C are scanning electron microscope photographs showing surfaces of a doped polysilicon treated with phosphoric acid.
Figure 12B:
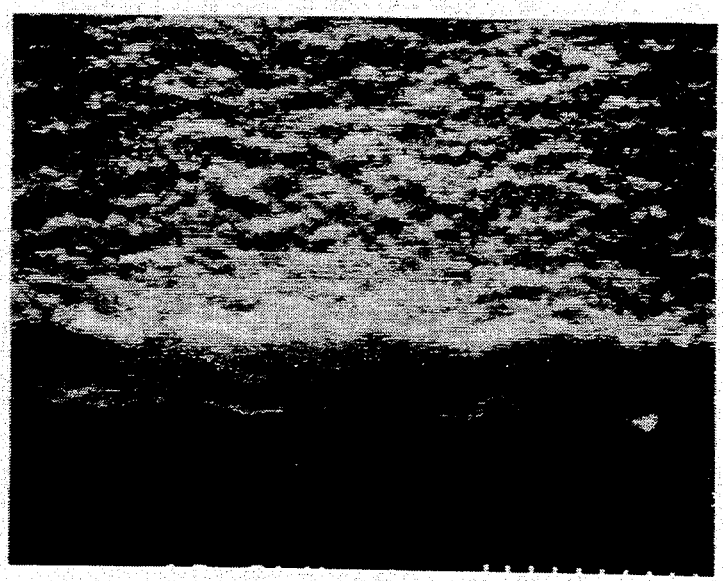
Figure 12C:

The phosphoric acid selectively etches heavily doped silicon, and this phenomenon is clearly understandable from FIGS. 11A to 11C and FIGS. 12A to 12C. When intentionally undoped polysilicon films are treated with phosphoric acid for 10 minutes, 30 minutes and 90 minutes, the surfaces of the undoped polysilicon films are hardly affected by the phosphoric acid as shown in FIG. 11A to 11C. However, after polysilicon films are placed in $POCl_3$ gas at 800 degrees in centigrade for 30 minutes, the doped polysilicon films are treated with phosphoric acid, and the surfaces of the doped polysilicons are roughened as shown in FIGS. 12A to 12C. The photo images show the rugged surfaces treated with phosphoric acid for 10 minutes, 30 minutes and 90 minutes, respectively. Although the photo images shown in FIGS. 11A to 11C are unchanged, micro-recesses of the doped polysilicon films are gradually developed in the doped polysilicon, and FIGS. 12A to 12C illustrate the development of the micro-recesses.

In a modified process, the etchant or the water solution of phosphoric acid is vaporized, and the vaporized etchant is blown onto the polysilicon film doped with phosphorus.

The porous portion is controllable with the growing conditions of the polysilicon, the doping conditions of the impurities, the conditions of the heat treatment and concentration, time period and temperature of the phosphoric acid treatment, and is highly reproducible. For example, the thickness of the porous portion is variable by changing the time period of the treatment with the phosphoric acid.

Figure 13:
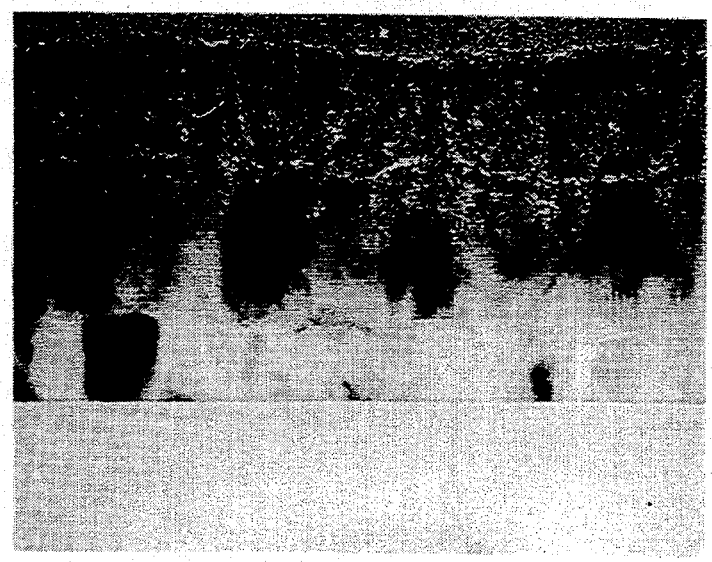
FIG. 13 is a scanning electron microscope photograph showing the cross section of a multi-level polysilicon film with an etching stopper.

However, if a thin silicon oxide film is inserted in a polysilicon, the thin silicon oxide film serves as an etching stopper, and the thickness of the porous portion is exactly controlled. Of course, the thin silicon oxide film is expected not to deteriorate electrical properties of the polysilicon electrode. For example, while polysilicon is deposited to 300 nano-meters, two silicon oxide films each 2 nano-meters thick are inserted in the polysilicon film, and, thereafter, phosphorus is doped into the polysilicon film at 800 degrees in centigrade for 30 minutes from $POCl_3$ gas. The multi-level structure implemented by the polysilicon films and the thin silicon oxide films is dipped in the etchant containing phosphoric acid at 140 degrees in centigrade for 60 minutes. The uppermost doped polysilicon film is perforated so that micro-recesses take place in the uppermost doped polysilicon. However, the thin silicon oxide film blocks the polysilicon thereunder from the etchant, and the thickness of the porous silicon is exactly controlled through insertion of the silicon oxide film. FIG. 13 is a scanning electron microscope photograph showing the multi-level structure, and it is understood that the thin silicon oxide film effectively blocked the lower polysilicon film from the etchant. The thin silicon oxide films inserted in the polysilicon increased the micro-recesses on the side surfaces of the multi-level structure. This is because of the fact that the crystal of polysilicon vertically grown, and grain boundaries on the side surface is less than those on the top surface of the multi-level structure. However, the thin silicon oxide films divide the column-like polysilicon crystal and allows the etchant to form micro-recesses at the interfaces between the polysilicon films and the thin silicon oxide films.

After the formation of the micro-recesses in the lower electrode 54a, a composite dielectric layer 55 is formed on the entire surface of the lower electrode 54a, and the composite dielectric layer 55 is implemented by a silicon nitride film 55a and a silicon oxide film 55b. Firstly, silicon nitride is deposited to thickness of 5 nano-meters to 10 nano-meters through the low-pressure chemical vapor deposition for forming the silicon nitride film 55a, and the surface of the silicon nitride film 55a is oxidized so that the silicon nitride film 55a is overlain by the silicon oxide film 55b. Dielectric substance with large dielectric constant such as $Ta_2O_5$ and ferroelectric substance are available for the dielectric layer 55.

Figure 7F:
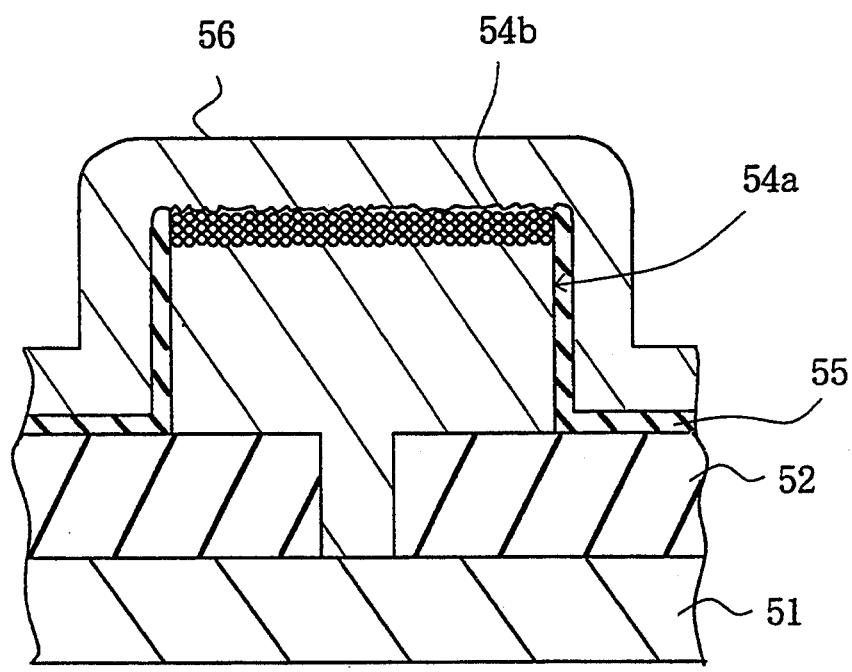
Figure 14:
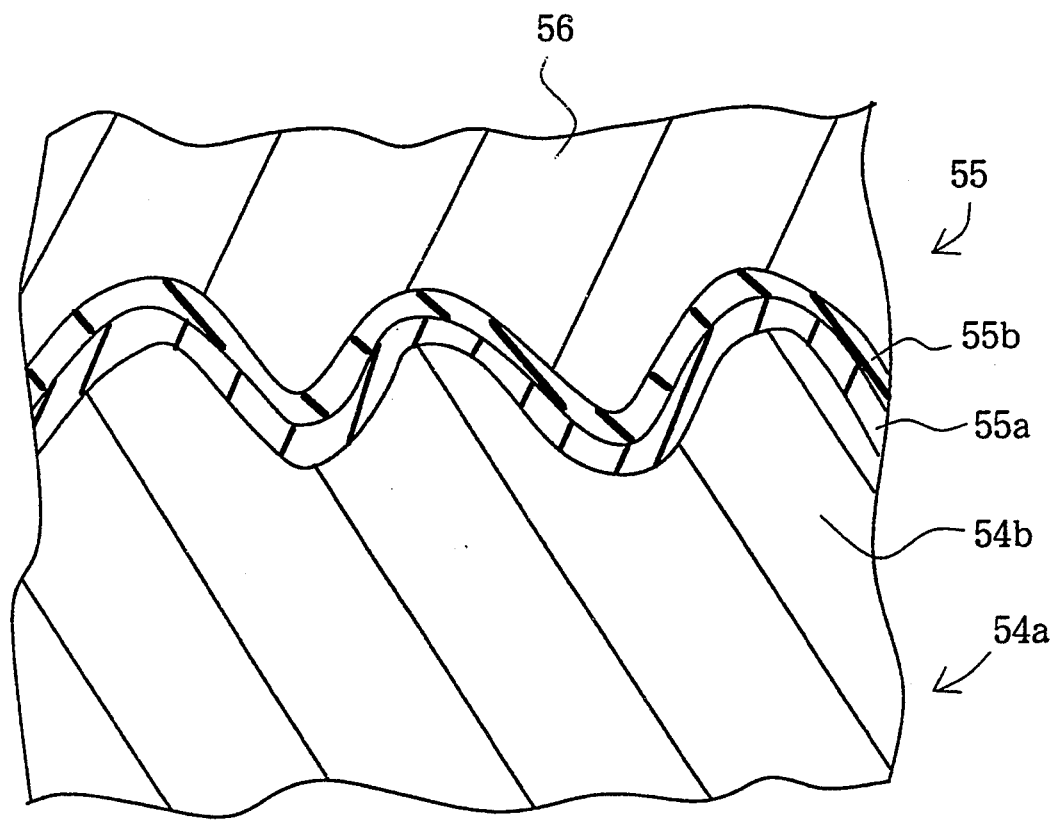
FIG. 14 is a cross sectional view showing a composite dielectric layer conformally extending over the surface of micro-recesses.

Finally, phosphorus-doped polysilicon is deposited on the entire surface of the structure, and the phosphorus-doped polysilicon film is patterned into an upper electrode 56 through the lithographic process followed by a reactive ion etching. The resultant structure of this stage is illustrated in FIG. 7F. Since the micro-recesses are large enough to allow the composite dielectric layer 55 to conformally extend over the surface thereof, the phosphorus-doped polysilicon fills the secondary micro-recesses defined by the composite dielectric layer 55 as shown in FIG. 14, and the surface area of the capacitor is surely increased.

As described hereinbefore, the polysilicon film 54 is patterned to the lower electrode 54a before the formation of the micro-recesses, and, for this reason, the micro-recesses are not grinded by the etchant. However, even if the polysilicon film 54 is patterned after the formation of the micro-recesses, the surface area of the capacitor is fairly increased.

Fourth Embodiment

Figure 15A:
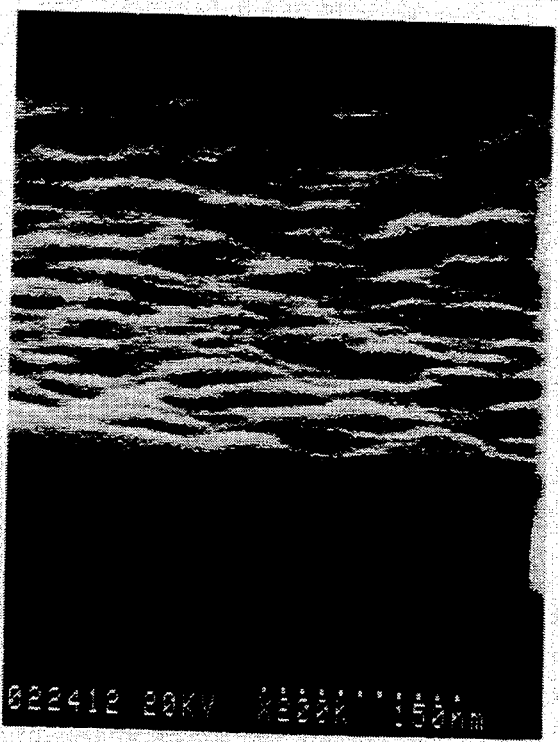
FIGS. 15A to 15C are scanning electron microscope photographs showing surfaces of ion-implanted polysilicon films treated with phosphoric acid solution.
Figure 15B:
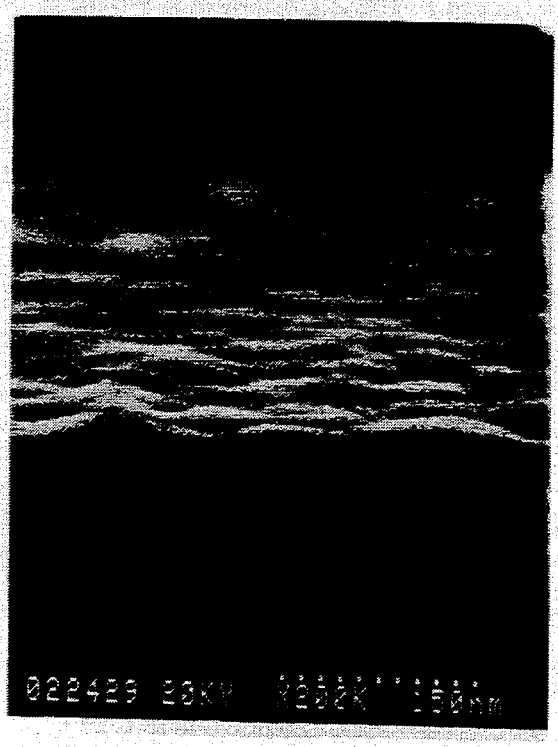
Figure 15C:
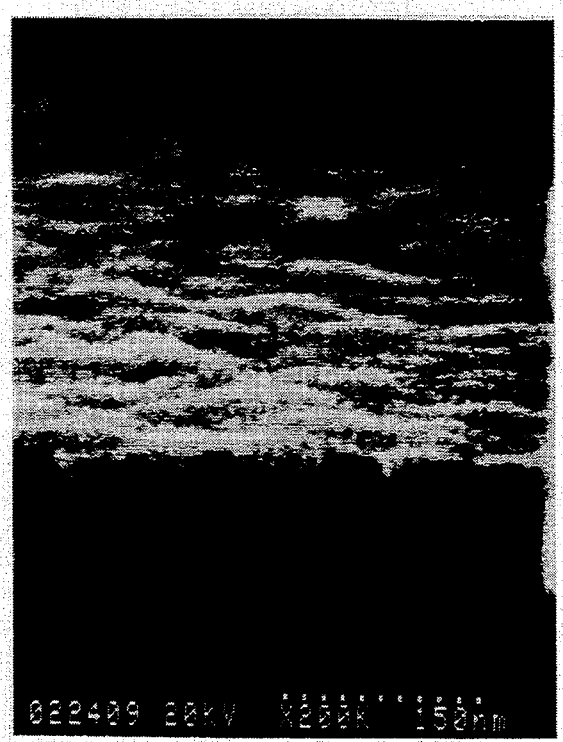

A process sequence implementing the fourth embodiment is similar to that of the third embodiment except for a doping stage before the formation of the micro-recesses, and, for this reason, films and portions in the fourth embodiment are designated by the same references as the corresponding films and portions of the third embodiment. Namely, after the deposition of the polysilicon film 54, phosphorus atoms are ion implanted into the polysilicon film 54 at dose of $1 \times 10^{16}$ cm$^{-2}$ under acceleration energy of 70 eV. The doped polysilicon 54 is, then, annealed at 900 degrees in centigrade for 30 minutes, and is dipped in an etching solution containing phosphoric acid at 140 degrees in centigrade. FIGS. 15A to 15C are scanning electron microscope photographs showing the rugged surfaces of the ion-implanted polysilicon films treated with the etching solution for 10 minutes, 20 minutes and 60 minutes, respectively. These microscope photographs teach that the phosphorus atoms ion-implanted into the polysilicon film allowed the etching solution to form micro-recesses of the order of 5 nano-meters.

The ion-implanted phosphorus atoms are segregated along grain boundaries and around dislocations, and allows the etching solution to selectively etch the ion-implanted polysilicon. However, any impurities segregated along the grain boundaries and around the dislocations are available for the ion-implantation, and boron atoms, arsenic atoms and antimony atoms are used in the modifications of the process sequences implementing the fourth embodiment.

Fifth Embodiment

One of the particular features of the fifth process sequence embodying the present invention is directed to in-situ doping. While depositing silicon through a low pressure chemical vapor deposition in gaseous mixture of SiH$_4$ and PH$_3$ at 0.6 torr, phosphorus atoms are doped in the silicon film, and the doped silicon is treated with phosphoric acid solution at 140 degrees in centigrade.

If the low pressure chemical vapor deposition is carried out at 630 degrees in centigrade, doped polysilicon is deposited, and phosphorus atoms are segregated along the grain boundaries and around dislocations. For this reason, the phosphoric acid solution is directly applied to the doped polysilicon film.

Figure 16:
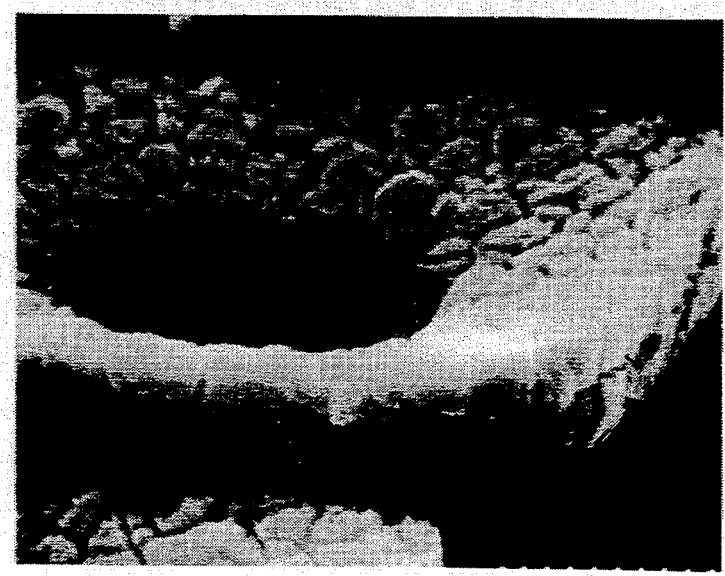
FIG. 16 is a scanning electron microscope photograph showing a surface of a silicon film crystallized from the amorphous silicon.

However, if the low pressure chemical vapor deposition is carried out at 550 degrees in centigrade, amorphous silicon is deposited, and the amorphous silicon film is annealed at 900 degrees in centigrade for 30 minutes so that large sized silicon grain are grown. The phosphorus are segregated along the grain boundaries and around the dislocations, and the phosphoric acid solution produces micro-recesses larger in diameter than those formed in the polysilicon film. FIG. 16 is a scanning electron microscope photograph showing the rugged surface of the silicon film crystallized from the amorphous silicon film, and the silicon film of 400 nano-meters thick was treated with the phosphoric acid solution for 90 minutes. The microscope photograph shows the large-sized micro-recesses.

Sixth Embodiment

Figure 17:
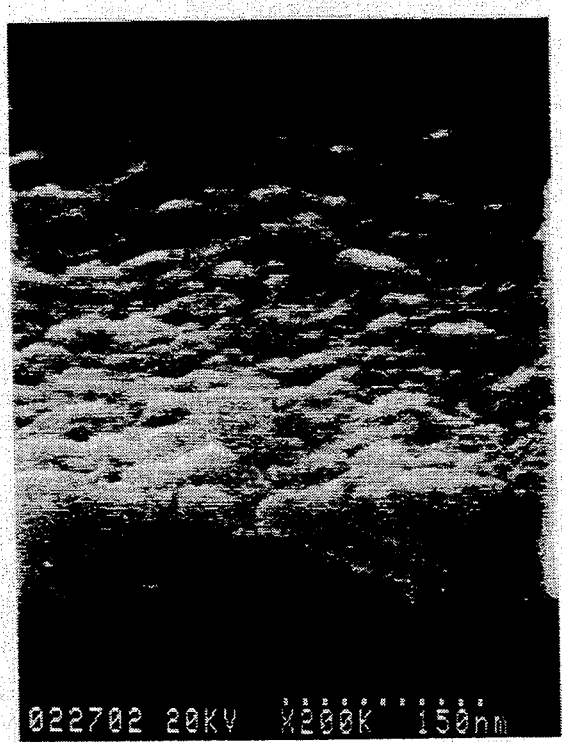
FIG. 17 is a scanning electron microscope photograph showing a surface of polysilicon film treated with ammonia.

The sixth process sequence embodying the present invention is similar to the third embodiment except for formation of micro-recesses, and films and portions of the sixth embodiment are designated by the same references denoting the corresponding films and portion of the third embodiment. After introducing the impurity atoms into the polysilicon film 54, the doped polysilicon film 54 is exposed to water solution of NH$_3$ at 60 degrees in centigrade. The water solution of NH$_3$ etches the doped polysilicon 54 at 5 nano-meters per minute, and deep micro-recesses take place in the doped polysilicon film 54 FIG. 17 is a scanning electron microscope photograph showing the rugged surface of the doped polysilicon film treated with the water solution of ammonia (NH$_3$). The micro-recesses were of the order of 5 nano-meters, and the rugged surface treated with ammonia were black.

The doped polysilicon film 54 may be exposed to vaporized water solution of ammonia, and an etchant containing hydrofluoric acid (HF) and nitric acid (HNO$_3$) and an etchant containing hydrofluoric acid and hydrogen peroxide (H$_2$O$_2$) are available for silicon films respectively doped with phosphorus atoms, arsenide atoms, boron atoms and antimony atoms.

Seventh Embodiment

As described hereinbefore, the doped polysilicon are perforated by using phosphoric acid or ammonia. However, the side surface of the polysilicon less are not rugged enough to increase the surface area. The seventh process sequence can increase the surface area of a polysilicon electrode.

Figure 18A:
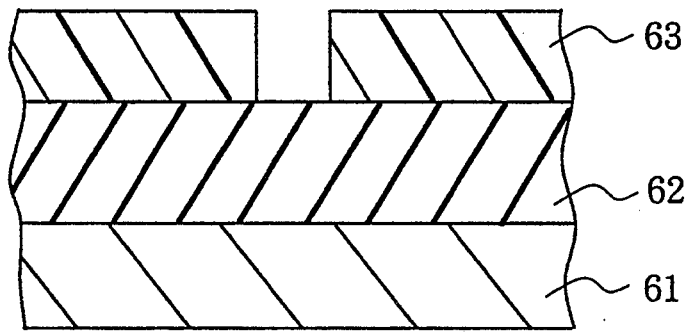
FIGS. 18A to 18H are cross sectional views showing a seventh process sequence according to the present invention.

The ninth process sequence starts with preparation of single crystal silicon substrate 61, and a silicon oxide film 62 is grown on the major surface of the silicon substrate 61. Photoresist solution is spun onto the silicon oxide film 62, and the photoresist film is patterned into a mask layer 63 partially covering the silicon oxide film 62 as shown in FIG. 18A.

Figure 18B:
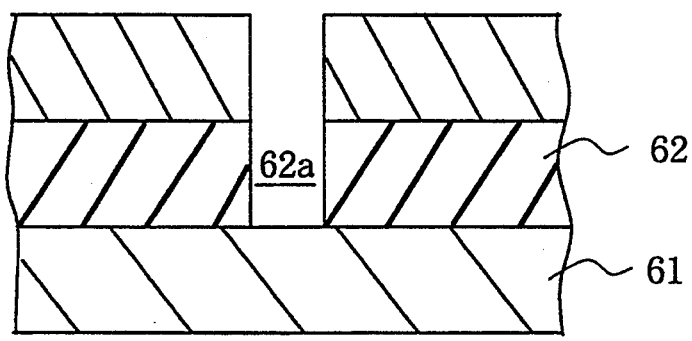

Subsequently, using the mask layer 63, the silicon oxide film 62 is partially etched away by using a dry etching technique, and a contact hole 62a is formed in the silicon oxide film 62 as shown in FIG. 18B.

The mask layer 63 is stripped off, and polysilicon is deposited on the entire surface of the structure through a low pressure chemical vapor deposition so that a polysilicon film 64 is formed in such a manner as to be held in contact with the silicon substrate 61 through the contact hole 62a. The chemical vapor deposition is carried out in gaseous mixture of SiH$_4$ and He at 600 degrees in centigrade, and SiH$_4$ and He are regulated to 20% and 80%, and the gaseous mixture is adjusted to 1 torr. Phosphorus atoms or arsenic atoms are introduced into the polysilicon film 64.

Figure 18C:
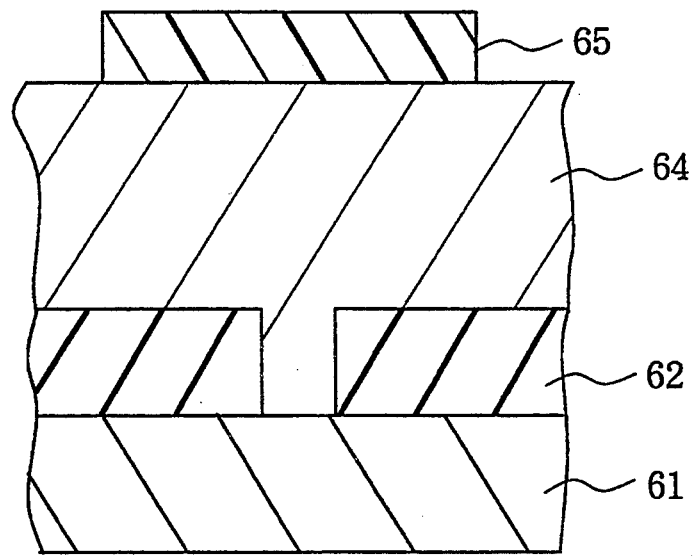
Figure 18D:
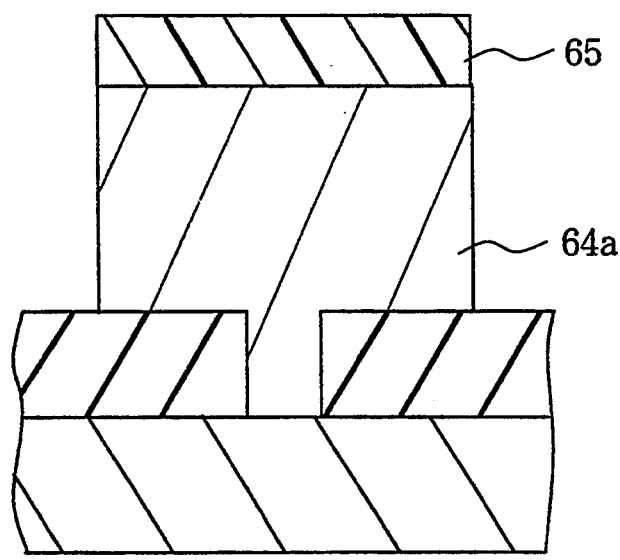

Photoresist solution is spun onto the polysilicon film 64, and is patterned into a mask layer 65 through the lithographic process as shown in FIG. 18C, and the polysilicon film 64 is partially removed by using a dry etching technique. The polysilicon film 64a thus patterned serves as a par of a lower electrode 64a of a stacked capacitor, and the resultant structure of this stage is illustrated in FIG. 18D.

Figure 18E:
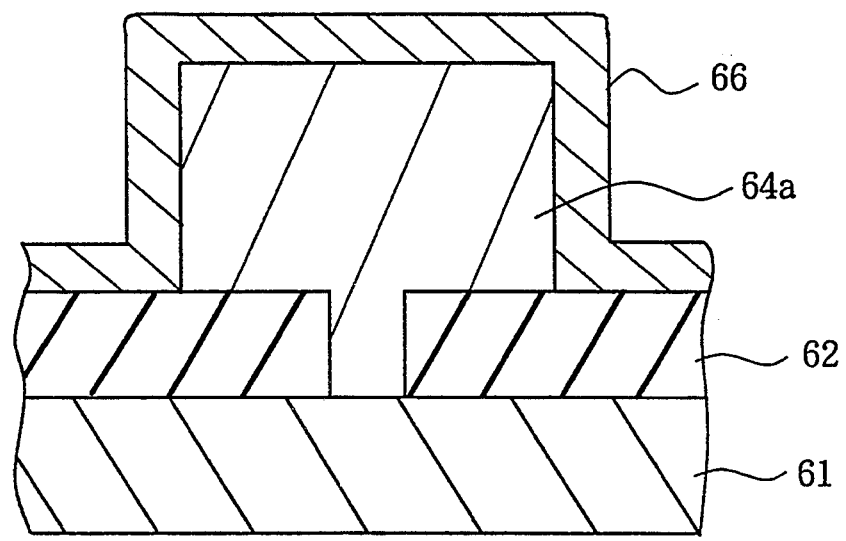

The mask layer 65 is stripped off, and a polysilicon film 66 is deposited to thickness of 150 nano-meters over the entire surface of the structure by using the low pressure chemical vapor deposition under the same conditions as the polysilicon film 64. Phosphorus is doped into the polysilicon film 66 in gaseous mixture containing $POCl_3$ at 800 degrees in centigrade for 30 minutes. The resultant structure of this stage is illustrated in FIG. 18E.

Figure 18F:
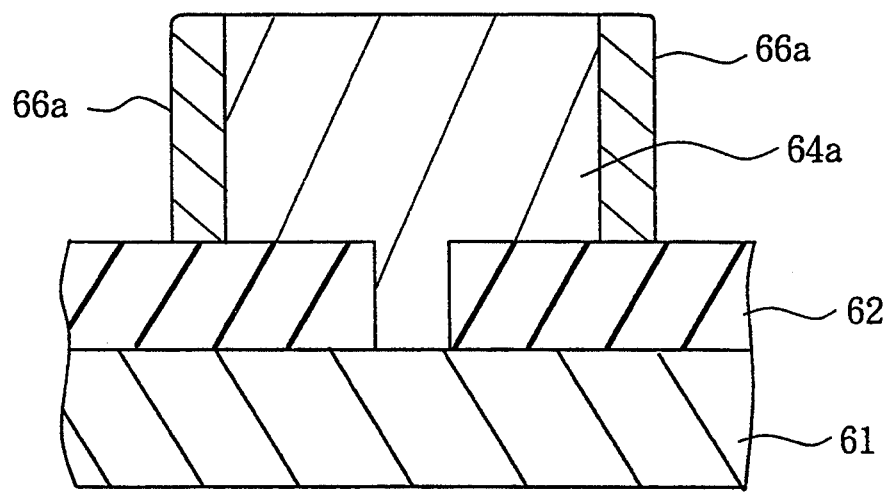

The doped polysilicon film 66 is then uniformly etched by using a reactive ion etching without any mask, and a polysilicon film 66a is left on the side surface the polysilicon film 64a. The polysilicon films 64a and 66a form in combination the lower electrode of the stacked capacitor, and the resultant structure of this stage is illustrated in FIG. 18F.

Although the polysilicon film 64a has column-like silicon grains vertically extending with respect to the major surface of the silicon substrate 61, the column-like silicon grains extend horizontally with respect to the major surface of the silicon substrate 61. For this reason, a large amount of grain boundaries are exposed to not only the top surface of the lower electrode but also the side surface of the lower electrode.

Figure 18G:
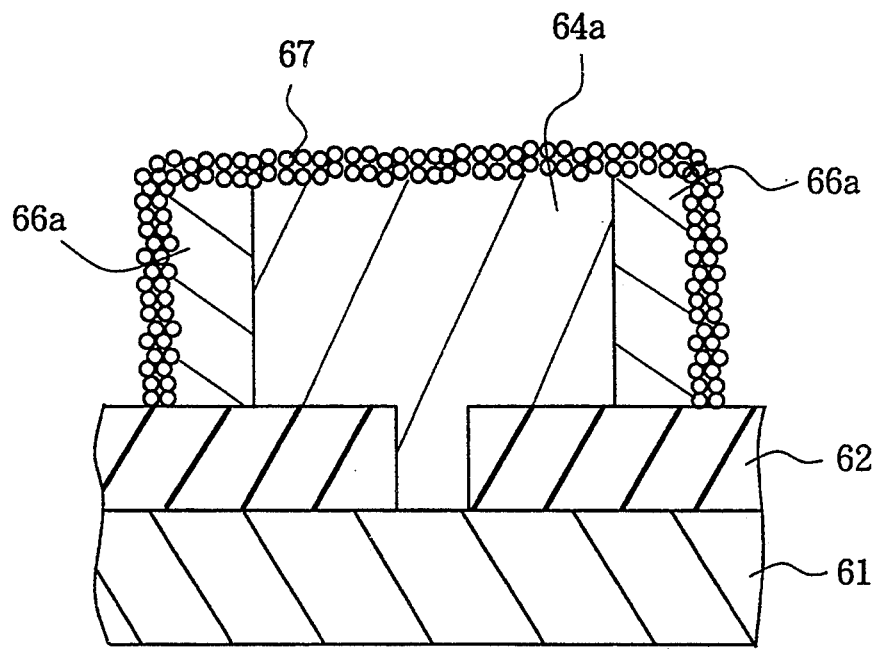
Figure 18H:
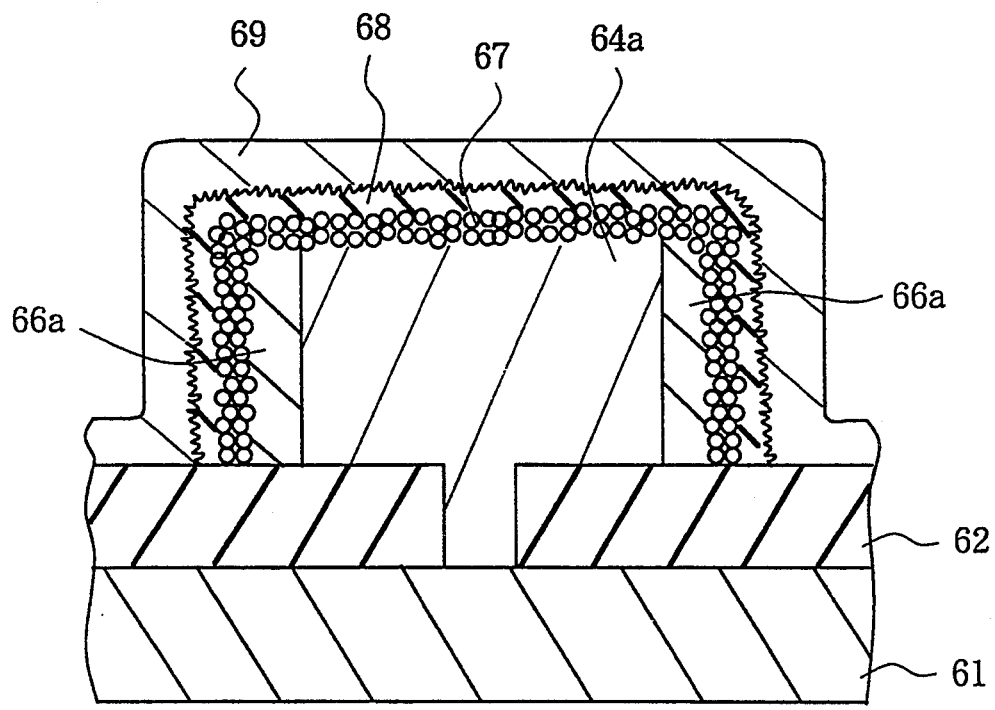

The lower electrode thus constructed is cleaned in mixture of hydrochloric acid and hydrogen peroxide, and is exposed to a water solution of $H_3PO_4$ at 140 degrees in centigrade for 60 minutes. As a result, the entire surface of the lower electrode is perforated by the $H_3PO_4$, and becomes rugged as shown in FIG. 18G. A large number of micro-recesses are exposed to the entire surface of the lower electrode, and the porous silicon film is designated by reference numeral 67.

Finally, a composite dielectric layer 68 is formed on the entire surface of the lower electrode, and is overlain by a polysilicon film 69 doped with phosphorous atoms. The polysilicon film 69 is patterned into an upper electrode of the stacked capacitor. Although the composite dielectric layer 68 is grown over micro-recesses of the porous silicon film 67, the hatched layer 68 is only indicative of the existence of the composite dielectric layer. In an actual product, the composite dielectric layer 68 conformally extends over the surface defining the micro-recesses, and never fills the micro-recesses. For this reason, the lower electrode formed by the polysilicon films 64a and 66a is twice as large in surface area as that of the third embodiment.

Figure 19A:
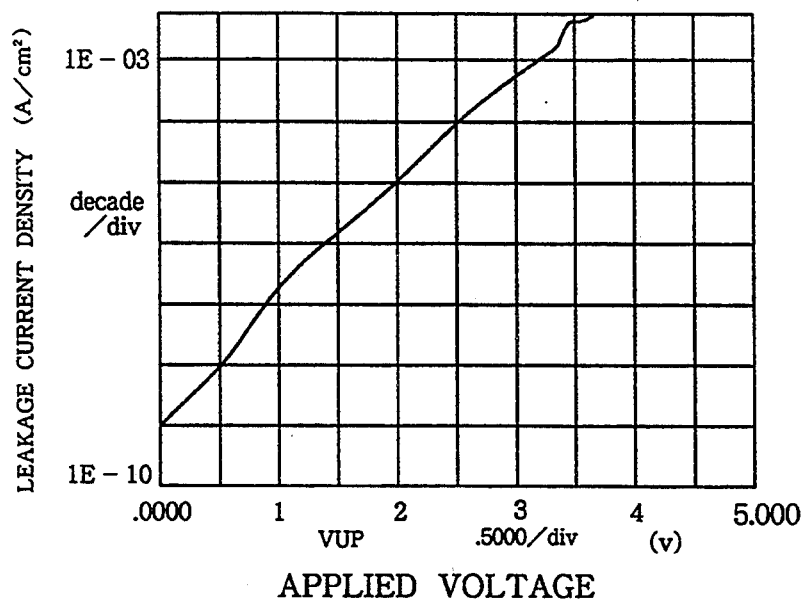
FIG. 19A is a graph showing leakage current density in terms of applied voltage to a polysilicon film with a porous surface.
Figure 19B:
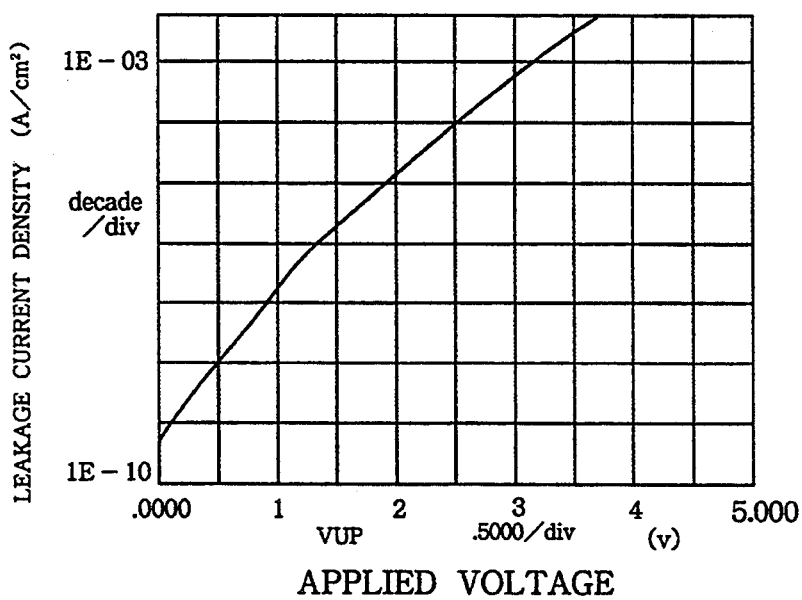
FIG. 19B is a graph showing leakage current density in terms of applied voltage to a polysilicon film without any porous surface.

The lower electrode of the seventh embodiment is excellent in electric properties. For example, leakage current is as small as that of a polysilicon film without any porous surface portion as shown in FIGS. 19A and 19B. FIG. 19A is a graph showing leakage current density in terms of applied voltage to the polysilicon film with the porous surface, and FIG. 19B is also a graph showing leakage current density in terms of applied voltage to a polysilicon film without any porous surface. Comparing FIG. 19A with FIG. 19B, the leakage current of the lower electrode implementing the seventh embodiment is as small as that of the ordinary polysilicon electrode.

Figure 20:
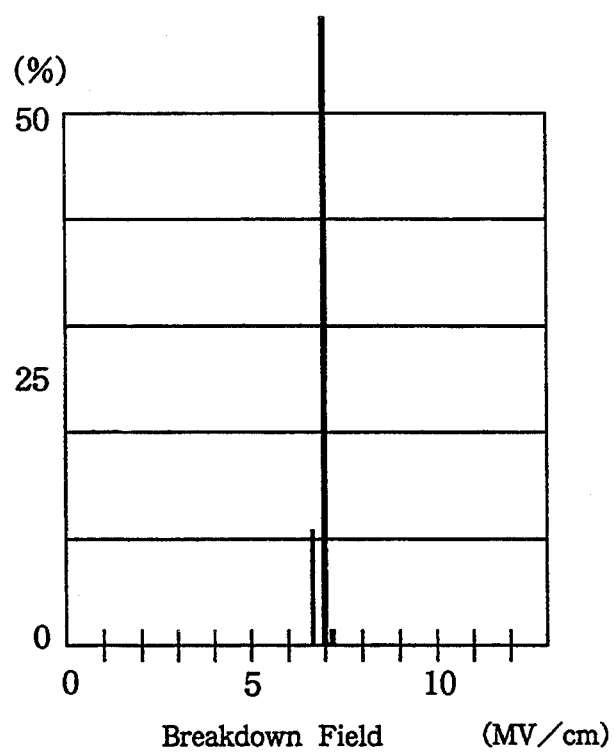
FIG. 20 is a graph showing percentage of breakdown in terms of electric field.

FIG. 20 shows breakdown characteristics of the polysilicon film with porous surface, and the breakdown characteristics are not deteriorated by the porous surface portion.

Eighth Embodiment

Figure 21A:
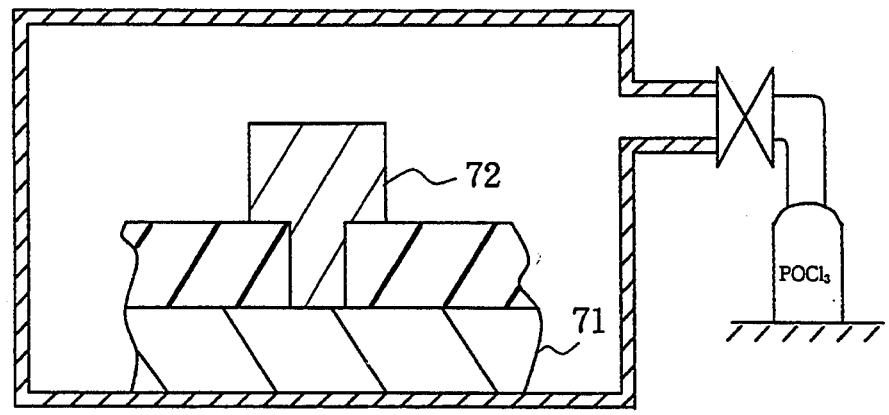
FIGS. 21A and 21B are cross sectional views showing essential stages of an eighth process sequence according to the present invention.
Figure 21B:
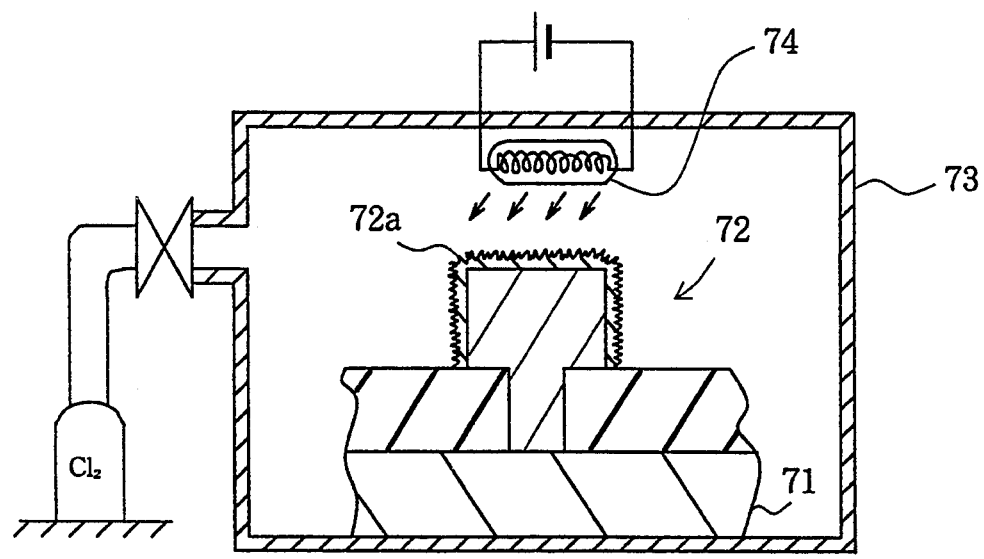

Turning to FIGS. 21A and 21B, the seventh process sequence embodying the present invention starts with preparation of a single crystal silicon substrate 71, and a polysilicon film of 200 nano-meters thick is patterned into a lower electrode 72 through a lithographic process followed by an etching stage. The lower electrode of polysilicon is exposed to $POCl_3$ gas at 800 degrees in centigrade for 30 minutes for introducing phosphorus atoms as shown in FIG. 21A. The phosphorus atoms are segregated along the grain boundaries and around dislocations in the polysilicon lower electrode 72.

Figure 22:
FIG. 22 is a scanning electron microscope photograph showing a surface of a doped polysilicon treated with chlorine radicals exited in the presence of ultra violet light.

The substrate 71 is placed in a chamber 73 filled with chlorine gas ($Cl_2$) at 1 torr, and ultra violet light is radiated from a lower-pressure mercury lamp 74, and chlorine radicals are produced in the presence of the ultra violet light. The chlorine radicals attacks the polysilicon doped with the phosphorous atoms, and selectively etches heavily doped polysilicon. In this instance, the lower electrode is exposed to the chlorine radicals for 5 minutes, and the heavily doped grain boundaries are etched away fifth to a hundred times faster than the remaining lightly doped polysilicon. As a result, the lower electrode 72 of polysilicon is perforated, and is covered with a rugged surface portion 72a as shown in FIG. 21B. FIG. 22 is a scanning electron microscope photograph showing the surface of the lower electrode exposed to the chlorine radicals in the eighth process sequence.

In the eighth embodiment, chlorine radicals are used as an etchant. However, other halogen radicals such as bromine or iodine are available. Moreover, halogen radicals can be produced through photo-exiting phenomenon, and micro-waves, high-frequency electromagnetic waves and plasma produced with an electron gun are available for producing the halogen radicals.

Ninth Embodiment

The ninth process sequence is similar to the third embodiment until deposition of a polysilicon film for a lower electrode. The polysilicon film as thick as 200 nano-meters is doped with phosphorus atoms in a gaseous atmosphere of $POCl_3$ at 800 degrees in centigrade for 30 minutes, and the phosphorus atoms are segregated along grain boundaries and around dislocations.

A mask layer is patterned on the polysilicon doped with phosphorus atoms through the lithographic process. The doped polysilicon thus partially covered with the mask layer is placed in a parallel plate reactive ion etching system, and an etchant containing chlorine ($Cl_2$) in the reactive chamber is regulated to 20 Pa. The chlorine radicals attack the doped polysilicon film, and the doped polysilicon exposed to the etchant is anisotropically etched away. While the etchant anisotropically patterns the doped polysilicon, the grain boundaries and heavily doped portions around the dislocations are etched by the chlorine radicals in spite of the mask layer, and micro-recesses isotropically take place in the surface portions of the doped polysilicon film. FIG. 23 is a scanning electron microscope photograph showing the surface of the doped polysilicon treated with the chlorine radicals.

Thus, the ninth process sequence allows the chlorine radicals to concurrently achieve the patterning into the lower electrode and formation of micro-recesses, and the process sequence is relatively simple.

In this instance, the parallel plate reactive ion etching system is used for producing chlorine radicals available for anisotropically patterning and the perforating. However, ECR and magnetron enhanced reactive ion etching systems and helicon-etching system may be used for producing the chlorine radicals. Moreover, another halogen radicals such as fluorine radicals, bromine radicals or iodine radicals concurrently patterns and perforates the doped polysilicon film.

Tenth Embodiment

Figure 24A:
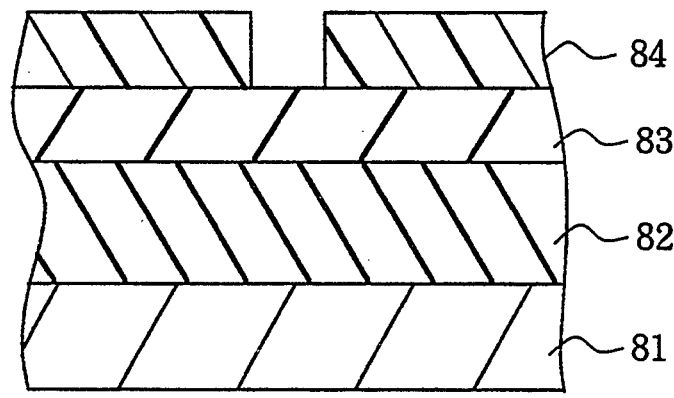
FIGS. 24A to 24H are cross sectional views showing a tenth process sequence according to the present invention.

Turning to FIGS. 24A to. 24H of the drawings, the tenth process sequence starts with preparation of a single crystal silicon 81. A silicon oxide film 82 is grown on the major surface of the silicon substrate 81 for electrical isolation, and a silicon nitride film 83 is deposited on the silicon oxide film 82 through a low pressure chemical vapor deposition. The silicon nitride film 83 aims at preventing the silicon oxide film 82 from hydrofluoric acid used in a later stage. Photoresist solution is spun onto the silicon nitride film 83, and is patterned into a mask layer 84 through the lithographic process as shown in FIG. 24A.

Figure 24B:
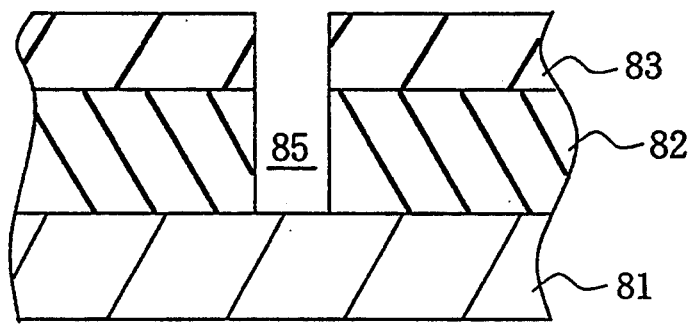

Using the mask layer 84, the silicon nitride film 83 and the silicon oxide film 82 are partially etched away so as to form a contact hole 85, and the mask layer 84 is stripped off. The resultant structure of this stage is illustrated in FIG. 24B.

Figure 24C:
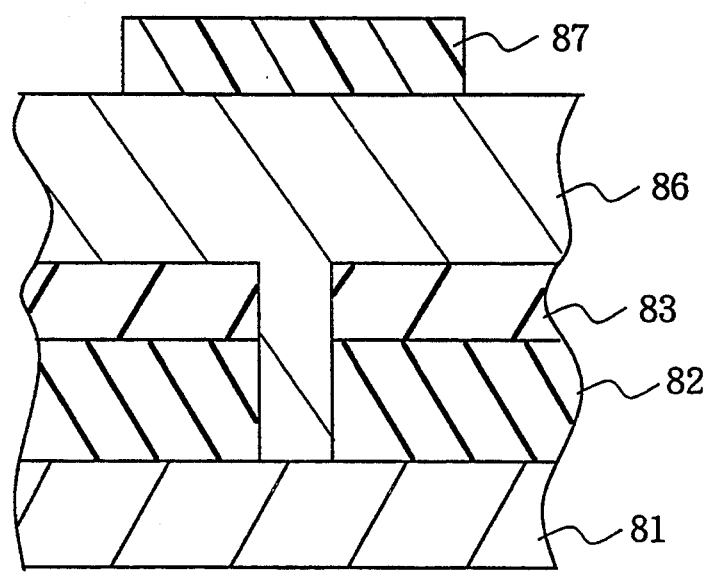

Subsequently, an amorphous silicon film is deposited on the entire surface of the structure through a low pressure chemical vapor deposition in gaseous mixture of $SiH_4$ and $PH_3$ at 0.6 torr, and the gaseous mixture is regulated at 550 degrees in centigrade. The amorphous silicon film is annealed at 800 degrees in centigrade for 120 minutes so that the amorphous silicon is converted into a polysilicon film 86. As described hereinbefore, the crystallized polysilicon is relatively large in grain size. Photoresist solution is spun onto the entire surface of the polysilicon film 86, and the photoresist film is patterned into a mask layer 87 through the lithographic process. The resultant structure of this stage is illustrated in FIG. 24C.

Using the mask layer 87, the polysilicon film 86 is partially etched away so as to form a lower electrode 86a, and the mask layer 87 is, thereafter, stripped off. The resultant structure of this stage is illustrated in FIG. 24D.

Figure 24D:
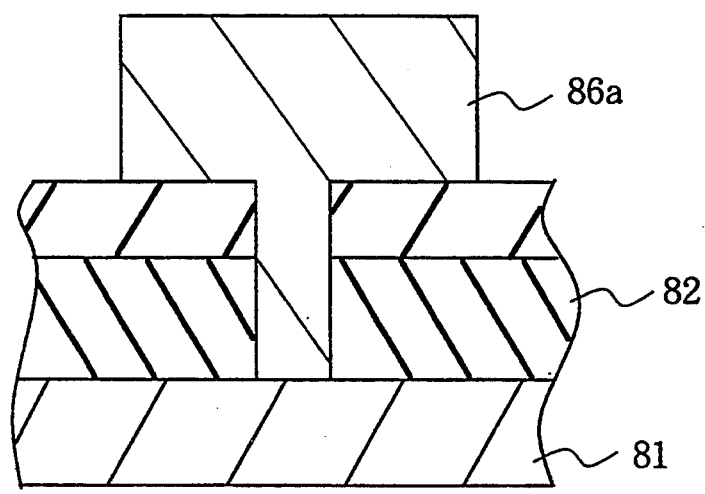
Figure 24E:
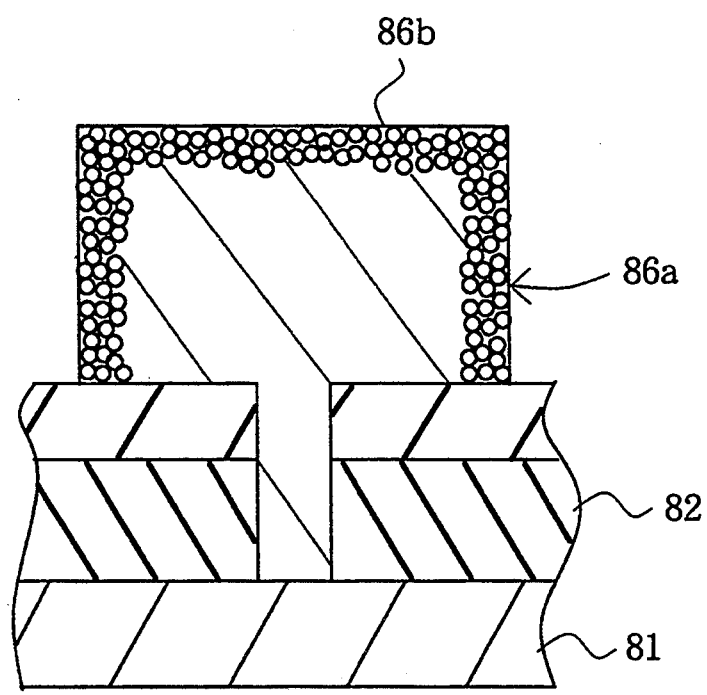

The structure shown in FIG. 24D is dipped in an electrolyte containing hydrofluoric acid between 5% to 40% by volume, and the lower electrode 86a is opposed to a platinum cathode (not shown). Direct current flows at hundreds milli-amperes/$cm^2$ between the lower electrode 86a serving as an anode and the platinum cathode so that the lower electrode 86a are perforated through anodizing phenomenon. The anodizing may be assisted by light in visual light to ultra violet light. Micro-recesses take place in the surface portion of the lower electrode 86a, and range from 2 nano-meters to tens nano-meters in diameter. The volume density of the porous silicon is regulated to 20% to 80% of the bulk density. The porous silicon 86b covers the entire surface, i.e., the top and side surfaces of the lower electrode 86a as shown in FIG. 24E.

Figure 24F:
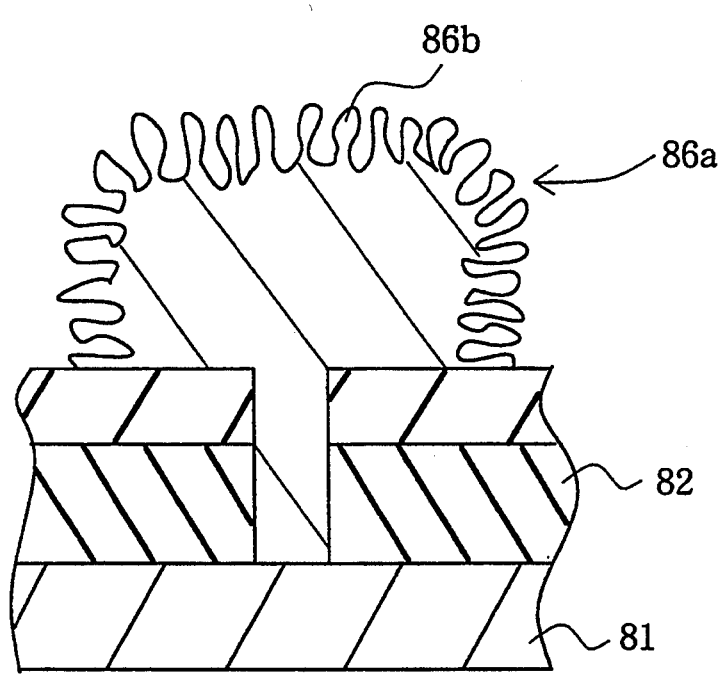

If the micro-recesses are less than several nano-meters, dielectric film deposited at a later stage is much liable to fill the micro-recesses, and the micro-recesses are expanded as shown in FIG. 24F. The expanding technique will be described in connection with the thirteenth embodiment.

Figure 24G:
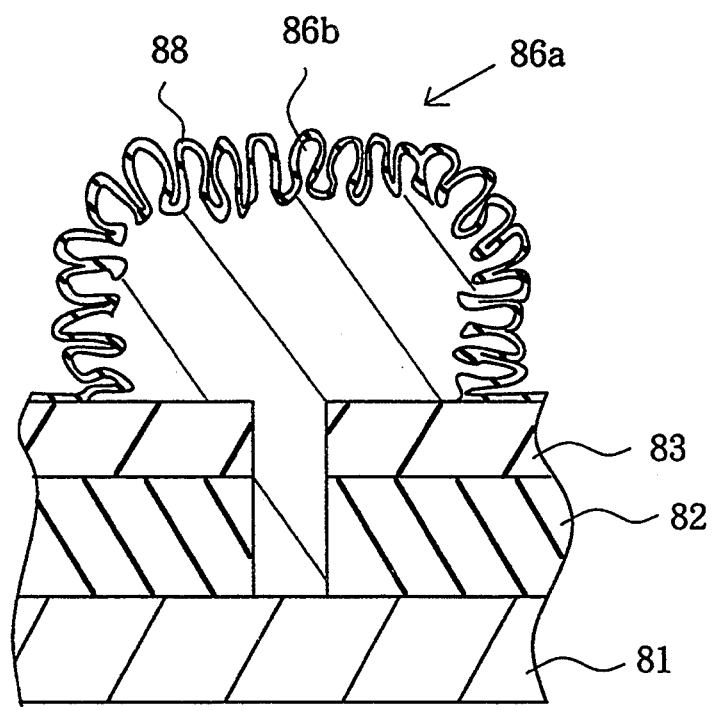
Figure 24H:
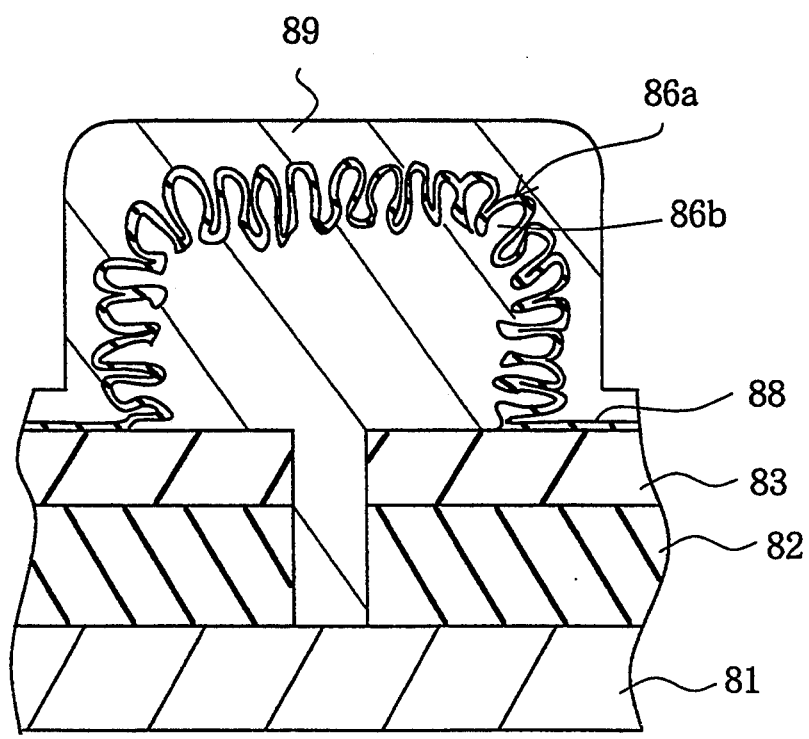

Subsequently, a composite dielectric layer 88 is conformally formed on the rugged surface of the porous silicon 86b as shown in FIG. 24G, and doped polysilicon is deposited over the entire surface of the structure. The doped polysilicon film is patterned into an upper electrode 89 as shown in FIG. 24H.

The porous silicon 86b treated with hydrofluoric acid increases the surface area tens times larger than that of the prior art electrode. In this instance, the composite dielectric film 88 partially extends on the silicon nitride film 83 and conformally extends on the porous silicon 86b. However, the silicon nitride film 83 may be removed before formation of the composite dielectric layer 88.

Although formation of porous silicon through anodizing is well known to a person skilled in the art, the porous silicon is applied to an isolation between circuit components, formation of a silicon-on-insulator, formation of silicide wiring and application of light emitting device. However, the porous silicon formed through the anodizing is never applied to increase of accumulated electric charges, and the present inventors believe the present invention to be new and advantageous.

Eleventh Embodiment

As described hereinbefore, if micro-recesses are too small, a dielectric film tends to fill the micro-recesses, and can not conformally extend over the surface of the porous silicon. When the dielectric film fills the micro-recesses, the surface area of the capacitor can not be increased, and the present invention can not achieve the large amount of accumulated electric charges without any increase of the occupation area. For this reason, it is desirable to insert an expanding stage between formation of micro-recesses and formation of a dielectric film.

In this instance, after formation of the micro-recesses, the porous silicon is exposed to oxidizing ambience at 1 torr at 700 degrees in centigrade for growing a silicon oxide film to 20 nano-meters to 30 nano-meters. The silicon oxide film is removed in hydrofluoric acid so that the micro-recesses are expanded. The other process sequence of the eleventh embodiment is similar to the aforesaid process sequences, and no further description is incorporated hereinbelow. The porous silicon surface may be rapidly oxidized, and the silicon oxide film is removed thereafter.

In order to precisely control the magnitude of the micro-recesses, the porous silicon is dipped in water solution containing hydrogen peroxide or nitric acid, and the silicon oxide is removed by using hydrofluoric acid. Since the silicon oxide is grown to 1 nano-meter to 2 nano-meters in every oxidation stage, the micro-recesses are expanded by 1 nano-meter to 2 nano-meter. If the oxidation and the removal are repeated, the micro-recesses are step-wise expanded.

Twelfth Embodiment

In the twelfth embodiment, micro-recesses are expanded as follows. A porous silicon surface is nitrized in an ammonia atmosphere at 800 degrees in centigrade for 60 minutes so that a silicon nitride is grown to 1.5 nano-meters to 2 nano-meters. The silicon nitride film is, thereafter, etched away in H₃PO₄ solution, and the nitrizing and the removal are repeated predetermined times.

Thirteenth Embodiment

If a porous silicon is rapidly oxidized or nitrized, small micro-recesses may be filled with silicon oxide or silicon nitride. Moreover, in order to srve as an electrode, the width of silicon should be at least twice as wide as depletion layer. For this reason, in the thirteenth embodiment, the porous silicon is annealed in non-oxidizing ambience, vacuum ambience or reducing ambience so as to recrystalize the silicon, and the recrystalized silicon grains become larger than those of the previous porous silicon. Even if micro-recesses are several nano-meters in diameter, the porous silicon treated in hydrogen ambience at 1000 degrees in centigrade for 5 minutes is recrystalized so as to have expanded micro-recesses as large as tens nano-meters. The recrystalization is reported by Takashi Unagami and Masahiro Seki in "Structure of Porous Silico Layer and Heat-Treatment Effect, J. Electrochem. Soc., SOLID-STATE SCIENCE AND TECHNOLOGY, August 1978, vol. 125, No. 8, page 1339.

Fourteenth Embodiment

Figure 25A:
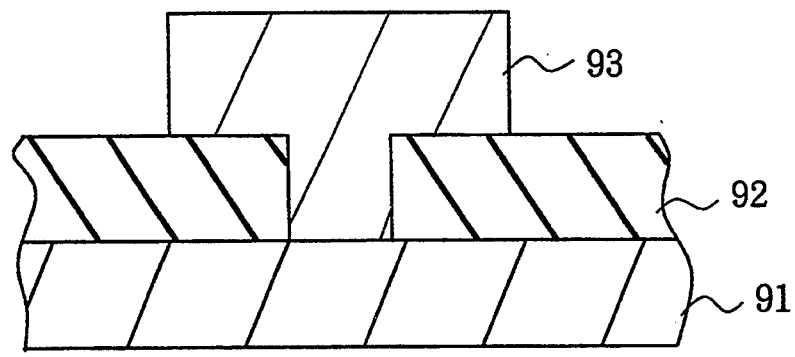
FIGS. 25A to 25D are cross sectional views showing a fourteenth process sequence according to the present invention.

Turning to FIGS. 25A to 25D of the drawings, the fourteenth process sequence embodying the present invention is start with preparation of a single crystal silicon substrate 91 partially covered with silicon oxide film 92. Amorphous silicon is deposited to thickness of 200 nano-meters through a low pressure chemical vapor deposition at 500 degrees in centigrade, and the amorphous silicon film is patterned into a lower electrode 93 by using a lithographic technique followed by a dry etching as shown in FIG. 25A.

Figure 25B:
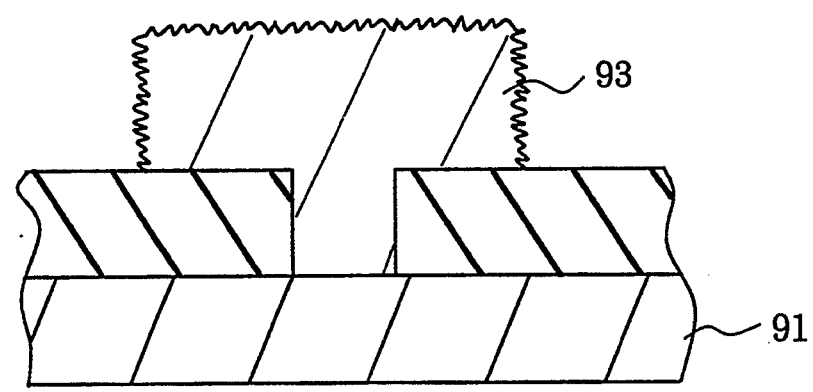

The silicon substrate 91 is heated to 750 degrees in centigrade, and the lower electrode 93 of amorphous silicon is annealed in vacuum in accordance with Japanese Patent Application 3-53933 already described. Then, hemispherical grains are grown, and covers the surface of the lower electrode 93 as shown in FIG. 25B.

Figure 25C:
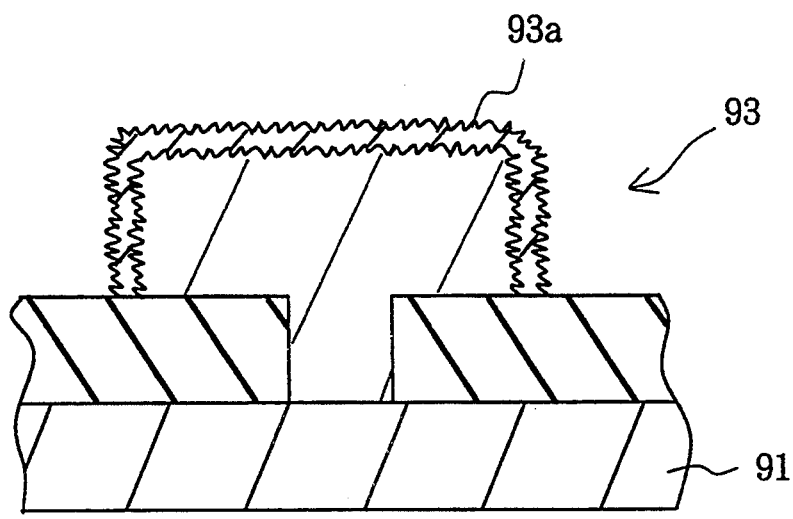
Figure 26:
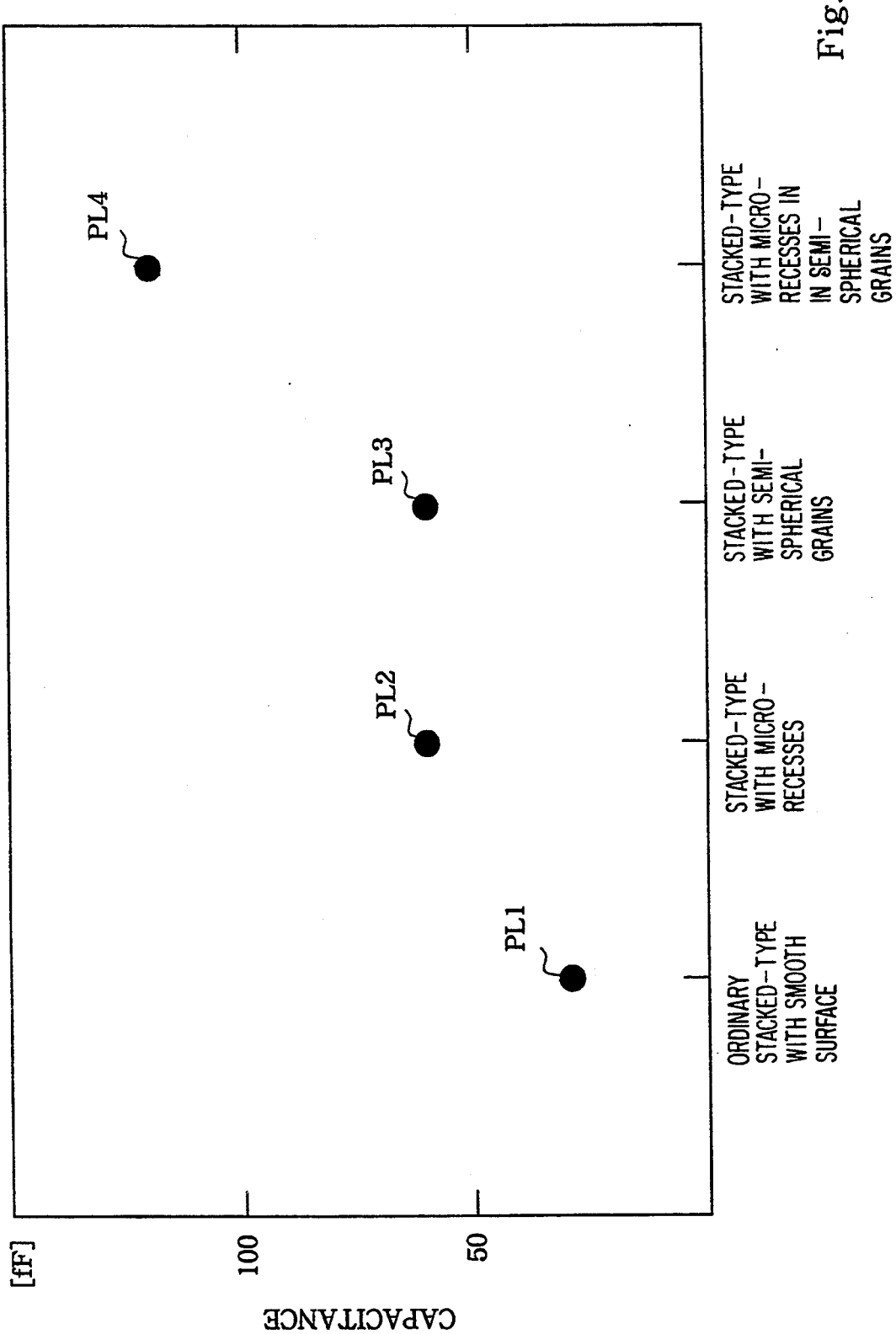
FIG. 26 is a graph showing capacitances achieved by various lower electrodes.

The resultant structure is placed in high temperature ambience at 800 degrees in centigrade, and phosphorus atoms are introduced from POCl₃ gas to the lower electrode 93 for 30 minutes. The phosphorus atoms are segregated along the grain boundaries and around dislocations, and the lower electrode 93 is dipt in phosphoric acid solution at 140 degrees in centigrade for 60 minutes. The lower electrode thus treated with phosphoric acid is covered with a porous silicon film 93a having the hemispherical grains as well as micro-recesses smaller in size than the semi-spherical grains as shown in FIG. 25C, and the surface area of the porous silicon film 93a is twice larger than the lower electrode covered with hemispherical grains only and four times lager than the ordinary polysilicon surface as shown in FIG. 26. In FIG. 26, Plots PL1, PL2, PL3 and PL4 respectively stand for an ordinary stacked type lower electrode without any treatment, a stacked type lower electrode with micro-recesses, a stacked-type lower electrode with hemispherical grains and a stacked-type lower electrode with micro-recesses in hemispherical grains.

Figure 25D:
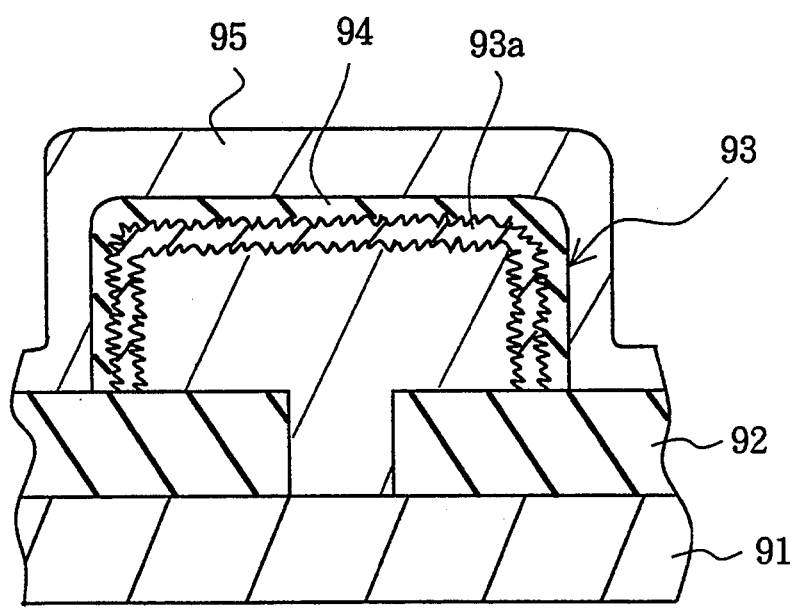

Finally, a composite dielectric layer 94 covers the porous silicon film 93a, and an upper electrode 95 is patterned from a doped polysilicon film as shown in FIG. 25D. Although the composite dielectric layer 94 forms the upper surface over the rugged surface in FIG. 25D, the composite polysilicon layer 94 conformally extends and forms secondary micro-recesses, and the doped polysilicon fills the secondary micro-recesses.

In this instance, the phosphorous atoms are introduced through diffusion. However, impurities atoms may be ion implanted into the hemispherical grains, or an in-site doping technology may be employed for the amorphous silicon film. Moreover, arsenic atoms may be introduced instead of the phosphorus atoms.

Fifteenth Embodiment

Even if a lower electrode is formed of amorphous silicon, phosphoric acid perforates the lower electrode. For example, a doped amorphous silicon film is deposited to thickness of 200 nano-meters through an in-site lower pressure chemical vapor deposition, and the phosphorus atoms are excessively doped at $1 \times 10^{21}$ cm$^{-3}$. The doped amorphous silicon film is patterned through the lithographic process followed by a dry etching. The lower electrode is dipped in a phosphoric acid solution at 140 degrees in centigrade for 60 minutes, and micro-recesses take place in the surface portion of the lower electrode. FIG. 27 is a scanning electron microscope photograph showing micro-recesses in the surface portion produced through the fifteenth process sequence. A composite dielectric layer and an upper electrode are successively laminated on the porous surface of the lower electrode, and a capacitor implementing the sixteenth embodiment is completed. The surface area of the lower electrode thus fabricated is twice as large as a smooth surface of a lower electrode with smooth surface.

In this instance, the phosphorus atoms are introduced through the in-site doping. However, even though any phosphorus is not doped, the amorphous silicon film can be perforated. Moreover, if silicon atoms are ion implanted into a polysilicon film doped with phosphorus atoms, the doped polysilicon film is converted to an amorphous silicon film.

Sixteenth Embodiment

In the sixteenth process sequence embodying the present invention, an amorphous silicon film is deposited by using a sputtering technique. Namely, a silicon substrate is placed in a sputtering system, and is heated to 100 degrees in centigrade. The silicon substrate is opposed to a target, and argon gas in the sputtering chamber is regulated to $6 \times 10^{-2}$ torr. Amorphous silicon is sputtered, and is deposited to thickness of 300 nano-meters. By virtue of oblique shadow effect, the deposited silicon film has a column structure, and vacancies take place among the columns.

Phosphorus atoms are diffused from POCl₃ gas into the deposited silicon film at 800 degrees in centigrade for 20 minutes, and is crystallized. A silicon oxide film is undesirably grown in the diffusion stage, and is removed by exposing to hydrofluoric acid. Then, the porous surface is completed.

If a phosphorus or boron doped silicon target is sputtered, a porous amorphous silicon film is deposited, and is annealed for recrystallization. Moreover, if a silicon target is sputtered in a source gas containing PH₃ or B₂H₆, the sputtering process is reactive, and the deposited film is annealed for recrystallization.

Formation of an amorphous silicon through a sputtering is described by Kiyoshi Takahasi and Makoto Konagai in "Amorphous Silicon Handbook" published by Science Forum in 1983.

Seventeenth Embodiment

A porous silicon film is produced through a lithographic process. Namely, a doped polysilicon is deposited to thickness of 500 nano-meters, and a target of silicon oxide is sputtered onto the doped polysilicon film to 50 nano-meters in gaseous mixture of argon and oxygen at $6\times 10^{-2}$ torr. The silicon oxide film thus sputtered consists of a large number of columns each tens nano-meters width, and the silicon oxide film is exposed to an etchant containing hydrofluoric acid at several %. Then, the gaps between the columns are expanded to 20 nano-meters. The structure is placed in a parallel plate reactive etching system, and the doped polysilicon is etched in an gaseous etchant containing chlorine at 20 Pa. Since the doped polysilicon film is exposed through the gaps of the silicon oxide film to the etchant, and is anisotropically etched. As a result, a large number of doped polysilicon columns are left, and, accordingly, micro-recesses are formed in the doped polysilicon film. The doped polysilicon columns are spaced apart from each other by tens nano-meters.

If the sputtering conditions are changed, islands-like mask layer or a mesh-like mask layer are obtainable, and are available for patterning the doped polysilicon film.

In this instance, the mask layer is formed from the silicon oxide film. However, any substance is available in so far as an etchant has a large selectivity between the doped polysilicon and the substance. Moreover, an electron cyclotron reactive etching system, a magnetron enhanced reactive ion etching system and a helicon etching system are available instead of the parallel plate reactive etching system.

Although particular embodiments of the present invention have been shown and described, it will be obvious to those skilled in the art that various changes and modifications may be made without departing from the spirit and scope of the present invention. For example, if a circuit component is improved in characteristics by increasing the surface area thereof, the present invention is applicable to the circuit component. Moreover, the upper electrode may be formed of another semiconductor material or conductive metal.

What is claimed is:

1. A process of fabricating a semiconductor device comprising the steps of:
   a) preparing a substrate for an integrated circuit having a capacitor;
   b) depositing a doped polysilicon film over said substrate for a lower electrode of said capacitor;
   c) perforating a surface portion of said doped polysilicon film by using an anodizing technique so that said surface portion of said doped polysilicon film becomes porous, said anodizing technique being carried out in water solution of hydrofluoric acid ranging from 5% to 40% by volume, direct current flowing between said doped polysilicon film and a platinum cathode at several milli-ampere/cm$^2$ to hundreds milli-ampere/cm$^2$ under radiation of light onto said doped polysilicon film, said light having a range of wavelengths corresponding to from visual light to ultra violet light;
   d) conformally covering at least said surface portion of said doped polysilicon film with a dielectric layer; and
   e) forming an upper electrode in such a manner as to oppose through said dielectric layer to said surface portion of said doped polysilicon film.

2. A process of fabricating a semiconductor device comprising the steps of:
   a) preparing a substrate for an integrated circuit having a capacitor;
   b) forming a phosphorus-doped polysilicon film for a lower electrode of said capacitor;
   c) perforating a surface portion of said phosphorus-doped polysilicon film having grooves along grain boundaries of said phosphorus-doped polysilicon film by using an etching in an etchant containing phosphoric acid so that said surface portion of said semiconductor block becomes porous, and comprising the sub-steps of
      c-1) introducing impurity atoms in said semiconductor block so as to segregate said impurity atoms along grain boundaries and around dislocations, and
      c-2) treating said semiconductor block with an etchant having an etching rate variable with concentration of said impurity atoms for selectively removing said grain boundaries and heavily doped portions around said dislocations, thereby forming micro-recesses in said predetermined surface portions of said semiconductor block;
   d) conformally covering at least said surface portion of said semiconductor block with a dielectric layer; and
   e) forming an upper electrode in such a manner as to oppose through said dielectric layer to said surface portion of said semiconductor block.

3. A process as set forth in claim 2, in which said semiconductor block is formed of polysilicon, and said impurity atoms and said etchant are phosphorus and vapor containing phosphoric acid.

4. A process of fabricating a semiconductor device comprising the steps of:
   a) preparing a substrate for an integrated circuit having a capacitor;
   b) forming a semiconductor block for a lower electrode of said capacitor, having the sub-steps of
      b-1) depositing a semiconductor material which can be etched by an etchant,
      b-2) depositing a substance hardly etched by said etchant on the film of said semiconductor material, and
      b-3) depositing said semiconductor material to a thickness on the film of said substance, the films of said semiconductor materials and the film of said substance form in combination said semiconductor block,
   c) perforating a surface portion of said semiconductor block by using an etching so that said surface portion of said semiconductor block becomes porous, having the sub-steps of
      c-1) introducing impurity atoms segregated along grain boundaries and around dislocations, and
      c-2) selectively etching said grain boundaries and heavily doped portions around said dislocations by using said etchant having a selectivity between heavily doped portion and lightly doped portion,
   d) conformally covering at least said surface portion of said semiconductor block with a dielectric layer; and
   e) forming an upper electrode in such a manner as to oppose through said dielectric layer to said surface portion of said semiconductor block.

5. A process as set forth in claim 4, in which said sub-steps b-2) and b-3) are repeated after said sub-step b-1.

6. A process of fabricating a semiconductor device comprising the steps of:
   a) preparing a substrate for an integrated circuit having a capacitor;
   b) forming a semiconductor block for a lower electrode of said capacitor;
   c) perforating a surface portion of said semiconductor block by using an etching so that said surface portion of said semiconductor block becomes porous, having the sub-steps of
      c-1) ion-implanting phosphorus atoms in said semiconductor block,
      c-2) annealing said semiconductor block so as to segregate said phosphorus atoms along grain boundaries and around dislocations, and
      c-3) treating said semiconductor block with an isotropical etchant having an etching rate variable with concentration of said phosphorus atoms for selectively removing said grain boundaries and heavily doped portions around said dislocations, thereby forming micro-recesses in said predetermined surface portions of said semiconductor block;
   d) conformally covering at least said surface portion of said semiconductor block with a dielectric layer; and
   e) forming an upper electrode in such a manner as to oppose through said dielectric layer to said surface portion of said semiconductor block.

7. A process of fabricating a semiconductor device comprising the steps of:
   a) preparing a substrate for an integrated circuit having a capacitor;
   b) forming a semiconductor block for a lower electrode of said capacitor, and having the sub-steps of
      b-1) depositing amorphous silicon doped with phosphorus atoms, said amorphous silicon doped with said phosphorus atoms serving as said semiconductor block, and
      b-2) annealing said amorphous silicon so as to allow said phosphorus atoms to segregate along boundaries between large sized silicon grain as well as around dislocations;
   c) perforating a surface portion of said semiconductor block by using an etching through treatment with an isotropic etching solution containing phosphoric acid so that said surface portion of said semiconductor block becomes porous;
   d) conformally covering at least said surface portion of said semiconductor block with a dielectric layer; and
   e) forming an upper electrode in such a manner as to oppose through said dielectric layer to said surface portion of said semiconductor block.

8. A process of fabricating a semiconductor device comprising the steps of:
   a) preparing a substrate for an integrated circuit having a capacitor;
   b) forming a doped polysilicon block for a lower electrode of said capacitor;
   c) perforating a surface portion of said doped polysilicon block by using an etching in one of water solution of ammonia and vapor of ammonia, a mixture of hydrofluoric acid and nitric acid and a mixture of hydrofluoric acid and hydrogen peroxide so that said surface portion of said doped polysilicon block becomes porous;
   d) conformally covering at least said surface portion of said doped polysilicon block with a dielectric layer; and
   e) forming an upper electrode in such a manner as to oppose through said dielectric layer to said surface portion of said doped polysilicon block.

9. A process of fabricating a semiconductor device comprising the steps of:
   a) preparing a substrate for an integrated circuit having a capacitor;
   b) forming a semiconductor block for a lower electrode of said capacitor, comprising the sub-steps of
      b-1) depositing polysilicon over a major surface of said substrate so as to form a first polysilicon film having column-like grains oriented in a vertical direction with respect to said major surface,
      b-2) patterning said first polysilicon film so as to form a first polysilicon sub-block,
      b-3) depositing polysilicon over the entire surface so as to form a second polysilicon film, a side surface of said first polysilicon block being covered with a part of said second polysilicon film having column-like grains oriented in a substantially parallel direction to said major surface, and
      b-4) uniformly etching said second polysilicon film without any mask so that a second polysilicon sub-block is left on said side surface of said first polysilicon sub-block, said first and second polysilicon sub-blocks forming in combination said semiconductor block;
   c) perforating a surface portion of said semiconductor block by using a roughening technique selected so that said surface portion of said semiconductor block becomes porous, and comprising the sub-steps of
      c-1) introducing impurity atoms in said semiconductor block so as to segregate along grain boundaries and around dislocations, and
      c-2) exposing said semiconductor block doped with said impurity atoms to an etchant having an etching rate variable with concentration of said impurity atoms for selectively removing said grain boundaries and heavily doped portions around said dislocations, thereby forming micro-recesses in said predetermined surface portions of said semiconductor block;
   d) conformally covering at least said surface portion of said semiconductor block with a dielectric layer; and
   e) forming an upper electrode in such a manner as to oppose through said dielectric layer to said surface portion of said semiconductor block.

10. A process of fabricating a semiconductor device comprising the steps of:
    a) preparing a substrate for an integrated circuit having a capacitor;
    b) forming a semiconductor block for a lower electrode of said capacitor;
    c) perforating a surface portion of said semiconductor block by using a dry etching so that said surface portion of said semiconductor block becomes porous, having the sub-steps of
       c-1) introducing phosphorus atoms in said semiconductor block so as to segregate along grain boundaries and around dislocations, and c-2) exposing said semiconductor block doped with said phosphorus atoms to halogen radicals having an etched rate variable with concentration of said impurity atoms for selectively removing said grain boundaries and heavily doped portions around said dislocations, thereby forming micro-recesses in said predetermined surface portions of said semiconductor block;

d) conformally covering at least said surface portion of said semiconductor block with a dielectric layer; and e) forming an upper electrode in such a manner as to oppose through said dielectric layer to said surface portion of said semiconductor block.

11. The process as set forth in claim 10, in which said halogen radicals are produced from halogen atoms under one of photo-exiting phenomenon, a radiation of micro-waves, a radiation of high-frequency electromagnetic waves and a plasma produced with an electron gun.

12. A process of fabricating a semiconductor device comprising the steps of:

a) preparing a substrate for an integrated circuit having a capacitor;

b) depositing a doped polysilicon film on said substrate;

c) patterning and perforating said doped polysilicon film for a lower electrode of said capacitor by using a dry etching so that a surface portion of said lower electrode becomes porous, said dry etching being carried out by using halogen radicals produced in one of a parallel plate reactive etching system, a reactive ion etching system assisted by electron cyclotron resonance, a magnetron reactive ion etching system and helicon-etching system;

d) conformally covering at least said surface portion of said semiconductor block with a dielectric layer; and e) forming an upper electrode in such a manner as to oppose through said dielectric layer to said surface portion of said semiconductor block.

13. A process of fabricating a semiconductor device comprising the steps of:

a) preparing a substrate for an integrated circuit having a capacitor;

b) forming a semiconductor block for a lower electrode of said capacitor;

c) perforating a surface portion of said semiconductor block by using an anodizing technique so that said surface portion of said semiconductor block becomes porous, having the sub-steps of c-1) preparing an electrolyte containing hydrofluoric acid at 5% to 40% by volume and a cathode, c-2) causing said semiconductor block of polysilicon to oppose to said cathode in said electrolyte, and c-3) causing direct current to flow between said semiconductor block and said cathode for producing micro-recesses;

d) conformally covering at least said surface portion of said semiconductor block with a dielectric layer; and e) forming an upper electrode in such a manner as to oppose through said dielectric layer to said surface portion of said semiconductor block.

14. A process of fabricating a semiconductor device comprising the steps of:

a) preparing a substrate for an integrated circuit having a capacitor;

b) depositing a silicon film over said substrate for a lower electrode of said capacitor;

c) perforating a surface portion of said silicon film by using an anodizing technique so that said surface portion of said silicon film becomes porous, said anodizing technique being carried out in water solution of hydrofluoric acid ranging from 5% to 40% by volume, and direct current flows between said silicon film and a platinum cathode at several milli-ampere/$cm^2$ to hundreds milli-ampere/$cm^2$;

d) expanding micro-recesses produced in said surface portion of said silicon film comprising the sub-steps of d-1) dipping said surface portion of said silicon film in water solution containing one of hydrogen peroxide and nitric acid for growing a thin oxide film ranging between 1 nano-meter to 2 nano-meter;

d-2) exposing said thin oxide film in hydrofluoric acid for removing said thin oxide film, and d-3) repeating said sub-steps of d-1) and d-2);

e) conformally covering at least said surface portion of said silicon film with a dielectric layer; and f) forming an upper electrode in such a manner as to oppose through said dielectric layer to said surface portion of said silicon film.

15. A process of fabricating a semiconductor device comprising the steps of:

a) preparing a substrate for an integrated circuit having a capacitor;

b) depositing a silicon film over said substrate for a lower electrode of said capacitor;

c) perforating a surface portion of said silicon film by using an anodizing technique so that said surface portion of said silicon film becomes porous, said anodizing technique being carried out in water solution of hydrofluoric acid ranging from 5% to 40% by volume, and direct current flows between said silicon film and a platinum cathode at several milli-ampere/$cm^2$ to hundreds milli-ampere/$cm^2$;

d) expanding micro-recesses produced in said surface portion of said silicon film, comprising the sub-steps of d-1) exposing said predetermined surface portion to solution containing ammonia for growing a silicon nitride film to 1.5 nano-meters to 2.0 meters, d-2) removing said silicon nitride film in a solution containing $H_3PO_4$, and d-3) repeating said sub-steps d-1) and d-2);

e) conformally covering at least said surface portion of said silicon film with a dielectric layer; and f) forming an upper electrode in such a manner as to oppose through said dielectric layer to said surface portion of said silicon film.

16. A process of fabricating a semiconductor device comprising the steps of:

a) preparing a substrate for an integrated circuit having a capacitor;

b) depositing a silicon film over said substrate for a lower electrode of said capacitor;

c) perforating a surface portion of said silicon film by using an anodizing technique so that said surface portion of said silicon film becomes porous, said anodizing technique being carried out in water solution of hydrofluoric acid ranging from 5% to 40% by volume, and direct current flows between said silicon film and a platinum cathode at several milli-ampere/cm² to hundreds milli-ampere/cm²;

d) expanding micro-recesses produced in said surface portion of said silicon film comprising the sub-steps of d-1) creating a high temperature annealing ambience from one of non-oxidizing ambience, vacuum ambience and reducing ambience, and d-2) recrystallizing said predetermined surface portion in said high temperature annealing ambience for producing large-sized micro-recesses;

e) conformally covering at least said surface portion of said silicon film with a dielectric layer; and f) forming an upper electrode in such a manner as to oppose through said dielectric layer to said surface portion of said silicon film.

17. A process as set forth in claim 16, in which said high temperature annealing ambience contains hydrogen.

18. A process of fabricating a semiconductor device comprising the steps of:

a) preparing a substrate for an integrated circuit having a capacitor;

b) forming a semiconductor block for a lower electrode of said capacitor, comprising the sub-steps of b-1) depositing an amorphous silicon film over said substrate, b-2) patterning said amorphous silicon film into a lower electrode serving as said semiconductor block, and b-3) annealing said lower electrode in vacuum under application of heat to said substrate for forming hemispherical grains over a surface of said lower electrode;

c) perforating a surface portion of said semiconductor block by using a roughening technique so that said surface portion of said semiconductor block becomes porous, comprising the sub-steps of c-1) introducing impurity atoms into said lower electrode so that said impurity atoms are segregated along grain boundaries and around dislocations, and c-2) exposing said lower electrode to an etchant containing phosphoric acid for perforating said lower electrode;

d) conformally covering at least said surface portion of said semiconductor block with a dielectric layer; and e) forming an upper electrode in such a manner as to oppose through said dielectric layer to said surface portion of said semiconductor block.

19. A process of fabricating a semiconductor device comprising the sub-steps of:

a) preparing a substrate for an integrated circuit having a capacitor;

b) forming a semiconductor block for a lower electrode of said capacitor, comprising the sub-steps of b-1) forming a doped amorphous silicon film through a chemical vapor deposition, and b-2) patterning said doped amorphous silicon film into a lower electrode serving as said semiconductor block;

c) perforating a surface portion of said semiconductor block by dipping said semiconductor block in an etching solution containing phosphoric acid so that said surface portion of said semiconductor block becomes porous;

d) conformally covering at least said surface portion of said semiconductor block with a dielectric layer; and e) forming an upper electrode in such a manner as to oppose through said dielectric layer to said surface portion of said semiconductor block.

20. The process as set forth in claim 2, in which said etchant containing phosphoric acid is heated to about 140 degrees centigrade for perforating said surface.

* * * * *